US009859885B2

(12) United States Patent
Kubota et al.

(10) Patent No.: US 9,859,885 B2
(45) Date of Patent: Jan. 2, 2018

(54) ELECTRONIC CIRCUIT AND SEMICONDUCTOR DEVICE

(71) Applicant: Hitachi, Ltd., Chiyoda-ku, Tokyo (JP)

(72) Inventors: Shunsuke Kubota, Tokyo (JP); Hiroyasu Yoshizawa, Tokyo (JP)

(73) Assignee: SII Semiconductor Corporation, Chiba-shi (JP)

(*) Notice: Subject to any disclaimer, the term of this patent is extended or adjusted under 35 U.S.C. 154(b) by 64 days.

(21) Appl. No.: 15/060,660

(22) Filed: Mar. 4, 2016

(65) Prior Publication Data

US 2017/0047921 A1    Feb. 16, 2017

(30) Foreign Application Priority Data

Aug. 11, 2015   (JP) .................... 2015-158915

(51) Int. Cl.
*H03K 17/00* (2006.01)
*H03K 17/22* (2006.01)
*H03K 19/0185* (2006.01)
*G06F 1/24* (2006.01)
*G06F 1/26* (2006.01)
*G01S 7/52* (2006.01)
*G01S 15/89* (2006.01)
*H03K 17/0812* (2006.01)
*H03K 19/003* (2006.01)
*H03K 17/10* (2006.01)
*H03K 17/30* (2006.01)

(52) U.S. Cl.
CPC .......... *H03K 17/223* (2013.01); *G01S 7/5202* (2013.01); *G01S 7/5205* (2013.01); *G01S 15/8915* (2013.01); *G06F 1/24* (2013.01); *G06F 1/263* (2013.01); *H03K 19/018521* (2013.01); *H03K 17/08122* (2013.01); *H03K 17/10* (2013.01); *H03K 17/30* (2013.01); *H03K 19/003* (2013.01); *H03K 19/00346* (2013.01)

(58) Field of Classification Search
None
See application file for complete search history.

(56) References Cited

U.S. PATENT DOCUMENTS

| 5,628,322 | A  | * | 5/1997 | Mine ................... G01N 29/036 600/453 |
| 7,161,387 | B2 |   | 1/2007 | Yamasaki et al. |
| 2008/0068369 | A1 | * | 3/2008 | Kobayashi ............. G09G 3/296 345/212 |
| 2011/0050322 | A1 | * | 3/2011 | Sicard .............. H03K 17/04206 327/419 |
| 2011/0068851 | A1 | * | 3/2011 | Kimura .................. H02J 9/061 327/408 |
| 2017/0033710 | A1 | * | 2/2017 | Muto .................... H02M 7/537 |

FOREIGN PATENT DOCUMENTS

JP     2005-102086 A    4/2005

* cited by examiner

*Primary Examiner* — Tuan T Lam
(74) *Attorney, Agent, or Firm* — Crowell & Moring LLP

(57) ABSTRACT

An electronic circuit includes a first level shift circuit, a second level shift circuit, an internal circuit, a high voltage circuit, first and second transistors, and first and second protective circuits. The first and second protective circuits perform control the first and second transistors so as to make them non-conductive when at least one of a plurality of types of power supply voltages becomes equal to or less than a predetermined value.

10 Claims, 6 Drawing Sheets

ELECTRONIC CIRCUIT AND SEMICONDUCTOR DEVICE

BACKGROUND OF THE INVENTION

1. Field of the Invention

The present invention relates to an electronic circuit and a semiconductor device and, more particularly, to an electronic circuit and a semiconductor device that operate by using a plurality of types of power supply voltages.

Various kinds of digital circuits such as a memory or a microprocessor are integrated on a semiconductor device. Further, the semiconductor device is provided with a power-on reset circuit so as to prevent malfunction from occurring in such digital circuits when a power supply voltage is supplied thereto.

The power-on reset circuit detects whether or not the power supply voltage supplied to a digital circuit (internal circuit) integrated on the semiconductor device exceeds or not a predetermined voltage value (specified voltage value) suitable for operating the digital circuit. When the power supply voltage exceeds the specified voltage, the power-on reset circuit resets, e.g., a flip-flop circuit constituting the digital circuit to an initial state to prevent the flip-flop circuit from being in an indefinite state. Thereafter, the power-on reset circuit cancels the reset, and the digital circuit resumes its operation. With this configuration, the digital circuit can be prevented from malfunctioning when the power supply voltage rises.

A digital circuit that operates using a plurality of types of power supply voltages, i.e., a plurality of different power supply voltages is provided with a plurality of level conversion circuits for signal propagation therein. In this case, malfunction may occur when any one of the plurality of power supply voltages is lowered. In such a case, the power-on reset circuit cannot sufficiently prevent malfunction of the digital circuit.

For example, JP- 2005-102086-A describes, as the digital circuit, a level shift circuit.

SUMMARY OF THE INVENTION

For example, a semiconductor device is used for an Diagnostic Ultrasound System. As the semiconductor device used for Diagnostic Ultrasound System, there can be exemplified a so-called "pulser" semiconductor device, which is a semiconductor device that outputs a drive signal to be supplied to an ultrasound oscillator so as to make the ultrasound oscillator generate an ultrasound wave. On the other hand, the Diagnostic Ultrasound System is provided with a receiver circuit that receives a reflected wave of the generated ultrasound wave through the ultrasound oscillator.

In order to generate the ultrasound wave by means of the ultrasound oscillator, it is necessary to apply, as the drive signal, a high voltage of, e.g., up to about ±100 V to the ultrasound oscillator. On the other hand, a transmitter signal to be supplied to the pulsar semiconductor device is a low voltage of, e.g., about 3.3 V. That is, the pulser semiconductor voltage is required to form a high voltage drive signal of, e.g., up to about ±100 V based on the low voltage transmitter signal of about 3.3 V.

To respond to this demand, the pulser semiconductor device performs level conversion (hereinafter, referred to also as "level shift") of the low voltage transmitter signal to form the high voltage drive signal. In this case, a potential of the high voltage drive signal is changed to a positive (+) side and a negative (−) side with respect to a ground voltage (reference voltage). Thus, as an operating power supply voltage, a plurality of types of voltages including positive and negative voltages are supplied to the pulser semiconductor device for the level conversion. That is, the pulse r semiconductor device uses a plurality of types of voltages (including the positive and negative polarities) having different potentials from one another to perform level conversion of the transmitter signal a plurality of times to thereby convert the low voltage transmitter signal to high voltage drive signal.

The pulsar semiconductor device is further provided. with an internal circuit that performs processing necessary to form the drive signal based on the transmitter signal. The processing to be performed by the internal circuit includes, e.g., decoding.

If a minute abnormality occurs in a power supply circuit that supplies a plurality of types of voltages to cause a voltage being supplied to the pulser semiconductor device to be changed, malfunction may occur in the internal circuit. If the malfunction occurs, a high voltage of up to about ±100 V is applied at an unexpected timing, which may damage the pulser semiconductor device. Further, if the malfunction occurs, a high voltage is applied to a receiver circuit or the like, which may damage it.

In particular, during development and/or test of the Diagnostic Ultrasound System, an unintended voltage drop may occur in a power supply voltage to be supplied to the pulser semiconductor device. Also in this case, a component constituting the Diagnostic Ultrasound System, such as the pulser semiconductor device or peripheral components (receiver circuit, etc.) thereof may be damaged due to the malfunction. If the component is broken, development of the Diagnostic Ultrasound System may be delayed.

JP-2005-102086-A describes a technology that prevents, in a level shift circuit that performs level conversion between different power supply voltages, a through current in a latch-type level shift circuit under a specific state where an operating power supply voltage for the internal circuit is lowered to thereby prevent a reduction in electric power and occurrence of an indefinite state. However, in JP-2005-102086-A, it is demanded that a power supply voltage other than the operating power supply voltage for the internal circuit be supplied sufficiently. Thus, necessity of use of a plurality of operating power supply voltages and prevention of malfunction which may occur due to unintended lowering of the power supply voltage are not taken into consideration.

An object of the present invention is to provide an electronic circuit and a semiconductor device that operate using a plurality of types of power supply voltages, which. are capable of preventing occurrence of malfunction.

The above object and other objects, and new features will become more apparent through the following description in conjunction with the drawings.

The typical ones of the inventions disclosed in the present application will be briefly described as follows.

In one embodiment, an electronic circuit includes a first level shift circuit, a second level shift circuit, a third level shift circuit, a fourth level shift circuit, an internal circuit, a high voltage circuit, a first transistor, a second transistor, a first protective circuit, and a second protective circuit.

Here, the first level shift circuit is supplied with a reference voltage, a first voltage having a first potential on a first polarity side with respect to the reference voltage, and a second voltage having a second potential higher than the first potential, is supplied with an input signal whose voltage is changed between the reference voltage and the first voltage, and outputs a first output signal obtained by level-shifting the input signal. The internal circuit is supplied with the reference voltage and the second voltage, receives the first output signal, and outputs second and third output signals according to the first output signal. The second level shift circuit is supplied with the reference voltage, the second voltage, and a third voltage having a third potential on a second polarity side with respect to the reference voltage and outputs a fourth output signal obtained by level-converting the third output signal.

Current paths in the first and second transistors are connected in series between a fourth voltage having a fourth potential higher than the second potential on the first polarity side with respect to the reference voltage and a fifth voltage having a fifth potential higher than the third potential on the second polarity side with respect to the reference voltage. The high voltage circuit is supplied with the reference voltage, the second voltage, the third voltage, the fourth voltage, and the fifth voltage, controls conduction of the first transistor according to the second output signal, and controls conduction of the second transistor according to the fourth output signal.

Moreover, the first protective circuit controls the internal circuit such that the internal circuit outputs the second and third output signals having levels that make the respective first and second transistors non-conductive when an absolute value of a potential of at least one of the first, second, and third voltages becomes equal to or less than a predetermined value. The second protective circuit controls the second level shift circuit so that the second transistor is made non-conductive by the fourth output signal when the absolute value of the potential of the second voltage becomes equal to or less than a predetermined value.

When the absolute value of the potential of at least one of the first, second, and third voltages becomes equal to or less than a predetermined value, the internal circuit forms the second and third output signals having levels that make the respective first and second transistors non-conductive. Further, when the absolute value of the potential of the second voltage becomes equal to or less than a predetermined value, the fourth output signal having a level that makes the second transistor non-conductive is output from the second shift circuit that converts the level of the third output signal. Thus, when the absolute value of the potential of one of the first and third voltages becomes equal to or less than a predetermined value, the first and second transistors are made non-conductive. Further, when the absolute value of the second voltage becomes equal to less than a predetermined value, the first transistor is made non-conductive by the second output signal from the internal circuit, and the second transistor is made non-conductive by the fourth output signal from the second level shift circuit.

As a result, when the absolute value of the potential of at least one of the first, second, and third voltages becomes equal or less than a predetermined value, the first and second transistors are made non-conductive, thereby making it possible to prevent the fourth and fifth voltages which are high voltages from being short-circuited through these transistors. Further, it is possible to prevent occurrence of such malfunction that the fourth voltage or fifth voltage which is a high voltage is output from the electronic circuit.

Further, when the absolute value of the potential of the second voltage becomes equal to or less than a predetermined value, the second protective circuit controls the second level shift circuit to output the fourth output signal having a level that makes the second transistor non-conductive. As a result, it is possible to make the second transistor non-conductive more reliably when the absolute value of the potential of the second voltage becomes equal to or less than a predetermined value, thereby making it possible to prevent occurrence of malfunction.

Further, in another embodiment, an electronic circuit operates using, as a power supply voltage, at least a first positive low-voltage power supply, a second positive low-voltage power supply providing a voltage higher than that of the first positive low-voltage power supply, a first negative low-voltage power supply, a first positive high-voltage power supply providing a voltage higher than that of the second positive low-voltage power supply, and a first negative high-voltage power supply providing a voltage lower than that of the first negative low-voltage power supply. The electronic circuit includes first and second level shift circuits, an internal circuit, a high voltage driver, first, second, third, and fourth reset circuits, and a logic circuit.

The first level shift circuit converts an input signal having a voltage level of the first positive low-voltage power supply into an output signal having a voltage level of the second positive low-voltage power supply. The internal circuit operates using the second positive low-voltage power supply, supplied with the output signal from the first level shift circuit, and forms first and second output signals according to the supplied output signal. The second level shift circuit converts a voltage level of the second output signal from the voltage level of the second positive low-voltage power supply to that of the first negative low-voltage power supply. The high voltage driver receives the first output signal and an output signal from the second level shift circuit and outputs a signal having a voltage level of the first positive high-voltage power supply or first negative low-voltage power supply.

The first reset circuit is supplied with the first positive low-voltage power supply, second positive low-voltage power supply, and ground voltage and outputs a reset signal whose high level corresponds to the voltage level of the second positive low-voltage power supply and whose low level corresponds to the voltage level of the ground voltage when the voltage of the first positive low-voltage power supply becomes equal to or less than a predetermined value. The second reset circuit is supplied with the second positive low-voltage power supply and. ground voltage and outputs a reset signal whose high level corresponds to the voltage level of the second positive low-voltage power supply and whose low level corresponds to the voltage level of the ground voltage when the voltage of the second positive low-voltage power supply becomes equal to or less than a predetermined value. The third reset circuit is supplied with the second positive low-voltage power supply, first negative low-voltage power supply, and ground voltage and outputs a reset signal whose high level corresponds to the voltage level of the second positive low-voltage power supply and whose low level corresponds to the voltage level of the ground voltage when an absolute value of the voltage of the first negative low-voltage power supply becomes equal to or less than a predetermined value. Furthermore, the fourth reset circuit is supplied with the second positive low-voltage power supply, first negative low-voltage power supply, and ground voltage and outputs a reset signal whose high level corresponds to the voltage level of the ground voltage and whose low level corresponds to the voltage level of the first negative low-voltage power supply when the voltage of the second positive low-voltage power supply becomes equal to or less than a predetermined value.

The logic circuit receives the reset signals from the first, second, and third reset circuits and puts the internal circuit into a predetermined state when one of the first positive low-voltage power supply, second positive low-voltage power supply, and first negative low-voltage power supply becomes equal to or less than a predetermined value. When the voltage of the second positive low-voltage power supply becomes equal to or less than a predetermined value, the second level shift circuit is put into a predetermined state by the reset signal from the fourth reset circuit.

When the absolute value of the voltage of at least the first positive low-voltage power supply, second positive low-voltage power supply, and first negative low-voltage power supply becomes equal to or less than a predetermined value, the internal circuit is put into a predetermined state. Further, when the absolute value of the voltage of the second positive low-voltage power supply becomes equal to less than a predetermined value, the second level shift circuit is put into a predetermined state. When the internal circuit is put into a predetermined state, the high voltage driver does not output the voltage levels of the first positive high-voltage power supply and first negative high-voltage power supply. As a result, it is possible to prevent occurrence of such malfunction that a high voltage is erroneously output from the electronic circuit when the absolute value of the voltage of at least the first positive low-voltage power supply, second positive low-voltage power supply, and first negative low-voltage power supply becomes equal to or less than a predetermined value. Further, when the absolute value of the voltage of the second positive low-voltage power supply becomes equal to or less than a predetermined value, the second level shift circuit is also put into a predetermined state, so that it is possible to more reliably prevent a high voltage from being erroneously output from the electronic circuit.

An advantage obtained by typical ones of the inventions disclosed in the present application will be briefly described as follows.

There can be provided an electronic circuit and a semiconductor device that operate using a plurality of types of power supply voltages, which are capable of preventing occurrence of malfunction.

DESCRIPTION OF THE PREFERRED EMBODIMENTS

Figure 1:
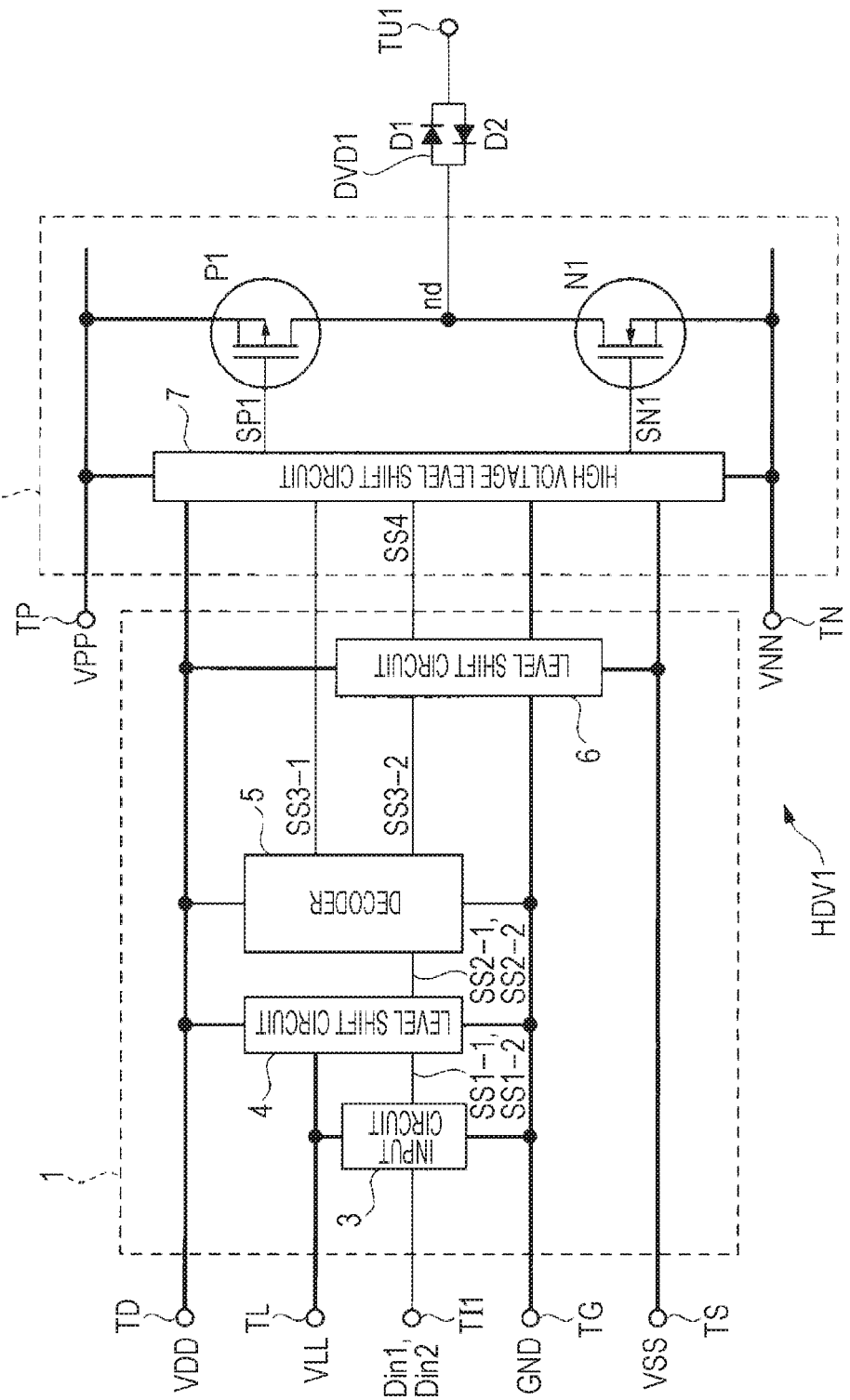
FIG. 1 is a block diagram illustrating a basic configuration of a transmitter circuit according to a first embodiment.

Embodiments of the present invention will be described in detail below based on the drawings. Throughout the accompanying drawings, the same reference numerals are used to designate the same or similar components, and repetitive descriptions thereof will be omitted.

In the following embodiments, a pulser semiconductor device is exemplified, but not limited thereto. Further, it can be considered that the pulser semiconductor device is formed by an electronic circuit such as a transmitter circuit which is formed on one semiconductor chip by a known semiconductor manufacturing technology.

First Embodiment

<Diagnostic Ultrasound System>

Figure 6:
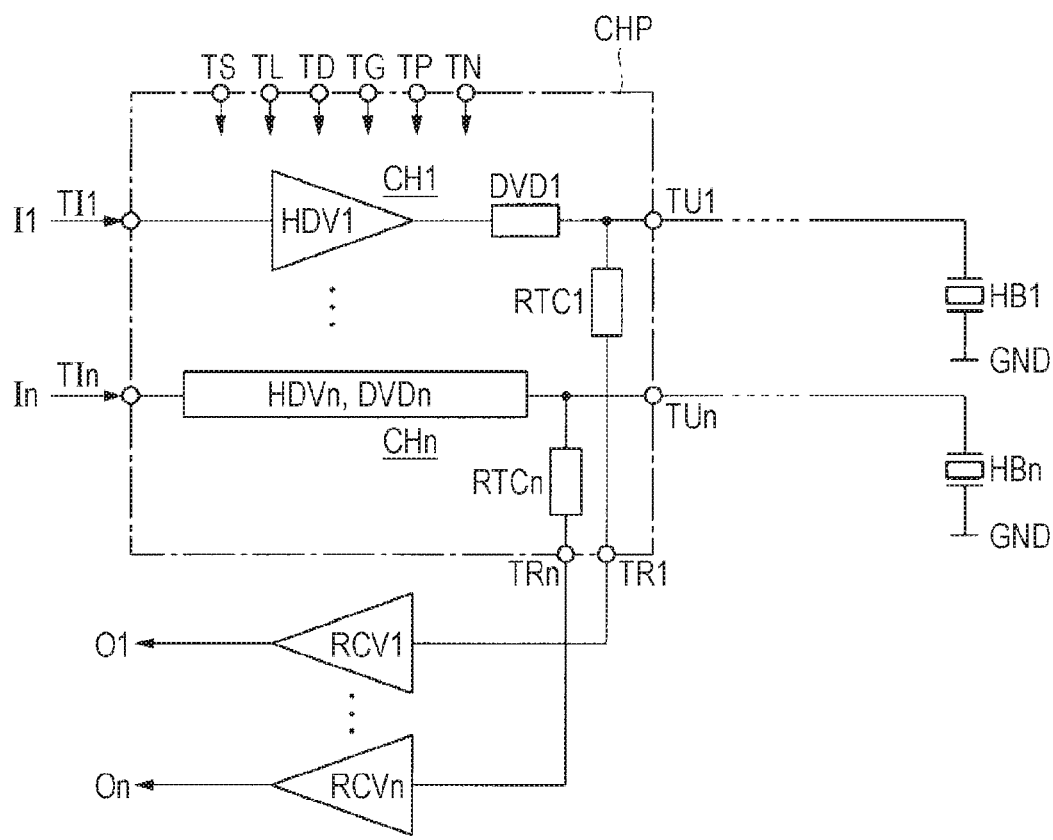
FIG. 6 is a block diagram schematically illustrating a configuration of an Diagnostic Ultrasound System according to the first embodiment.

FIG. 6 is an exemplary block diagram illustrating a configuration of an Diagnostic Ultrasound System according to a first embodiment. Here, a medical Diagnostic Ultrasound System is taken as an example. The Diagnostic Ultrasound System includes a pulser semiconductor device CHP, receiver circuits RCV1 to RCVn, and ultrasound oscillators HB1 to HBn.

The pulser semiconductor device CHP includes a plurality of (1 to n) transmitter units and a plurality of (1 to n) transmitter and receiver separation switches. One channel includes one transmitter unit and one transmitter and receiver separation switch, so, the pulser semiconductor device of FIG. 6 includes n channels CH1 to CHn. The plurality of transmitter units and plurality of transmitter and receiver separation switches are formed on one semiconductor chip by a known semiconductor manufacturing technology, although not especially limited. thereto, and are sealed in one package, although not especially limited thereto. FIG. 6 illustrates a state where the pulser semiconductor device CHP is sealed in the package. In FIG. 6, reference symbols TS, TL, TD, TG, TP, TN, TR1 to TRn, TI1 to TIn, and TU1 to TUn are each an external terminal provided in the package. In the following description, the above external terminals serve as external terminals of the pulser semiconductor device CHP.

The external terminals TS, TL, TD, TC, TP and TN are each a power supply terminal. The external terminals TI1 to TIn are each an input terminal to which transmitter signals I1 to In are supplied from a not illustrated processor. The external terminals TU1 to TUn are each an input/output terminal used for output of a drive signal and input of a receiver signal. The external terminals TR1 to TRn are each an output terminal that outputs the receiver signal input to each of the input/output terminals TU1 to TUn.

Different types of power supply voltages are supplied from a not illustrated power supply circuit to, respectively. The power supply voltages supplied to the power supply terminals TS, TL, TD, TG, TP and TN are supplied in common to the plurality of transmitter units. The transmitter units operate using the plurality of different types of power supply voltages supplied thereto as their operating power supply voltages, respectively.

The input terminals TI1 to TIn one-to-one correspond to the channels CH1 to CHn. Similarly, the input/output terminals TU1 to TUn and output terminals TR1 to TRn each one-to-one correspond to the channels CH1 to CHn. For example, the channel CH1 corresponds to the input terminal TI1, input/out terminal TU1, and output terminal TR1.

The channels CH1 to CHn have the same configuration, although not limited thereto. For example, the channel CH1 includes the transmitter unit and a transmitter and receiver separation switch RTC1, the transmitter unit having a transmitter circuit HDV1 and a separation circuit DVD1. The channels CH2 to CHn are configured similarly. FIG. 6 schematically illustrates a channel CHn including a transmitter unit having a transmitter circuit HDVn and a separation circuit DVDn and a transmitter and receiver separation switch RTCn, in addition to the channel CH1.

Inputs of the respective receiver circuits RCV1 to RCVn serving as peripheral components of the pulser semiconductor device CHP are connected respectively to the output terminals TR1 to TRn of the pulser semiconductor device CHP. The receiver circuits RCV1 to RCVn amplify the receiver signals from the respective output terminals TR1 to TRn and supply the resultant receiver signals to a not illustrated processor as output signals O1 to On.

The following describes, taking the channel CHI as an example, operation of the Diagnostic Ultrasound System. Upon generation of an ultrasound wave for ultrasound diagnosis, the transmitter signal I1 is supplied from a not illustrated processor to the input terminal TI1. The transmitter signal I1 supplied to the input terminal TI1 is level-converted from a low voltage to a high voltage by the transmitter circuit HDV1 in the channel CH1. The level-converted signal is then output, as a drive signal, from the input/output terminal TU1 through the separation circuit DVD1. The input/output terminal TU1 is connected with one terminal of the ultrasound oscillator HB1 (the other terminal of the ultrasound oscillator HB1 is connected to a ground voltage GND). A voltage of the drive signal to be output from the input/output terminal TU1 is periodically changed, according to the transmitter signal I1, to a positive (first polarity) side and a negative (second polarity) side with respect to the ground voltage GND. As a result, the ultrasound oscillator HB1 generates an ultrasound wave.

The generated ultrasound wave is irradiated to an object to be diagnosed, and a reflected wave from the object to be diagnosed is transmitted to the ultrasound oscillator HB1. The ultrasound oscillator HB1 supplies a detection signal corresponding to the received reflected wave to the input/output terminal TU1 as a receiver signal.

The transmitter and receiver separation switch RTC1 is made non-conductive upon generation of the ultrasound. wave to electrically separate the input/output terminal TU1 and output terminal TR1. On the other hand, upon detection of the reflected wave, the transmitter and receiver separation switch RTC1 is put into a conductive state. As a result, the receiver signal supplied to the input/output terminal TU1 is transmitted to the output terminal TR1 through the transmitter and receiver separation switch RTC1. The receiver signal transmitted to the output terminal TR1 is amplified by the receiver circuit RCV1 and output as the output signal O1. A not illustrated processor performs diagnosis based on the transmitter signal I1 supplied to the input terminal TI1 and output signal O1.

The channels CH2 to CHn each perform the same operation, and the diagnosis is performed in the same way as in the channel CH1.

As described above, the pulser semiconductor device CHP has the transmitter circuits HDV1 to HDVn each transmitter the drive signal for driving the corresponding ultrasound oscillator HB1. The drive signal to be transmitted is a voltage pulser generally having an amplitude of up to ±100 V. Further, the reflected wave generated by irradiation of the ultrasound wave generated by each of the ultrasound oscillators HB1 to HBn is converted into an electrical signal by each of the ultrasound oscillators HB1 to HBn, and the obtained electrical signal is amplified by each of the receiver circuits RCV1 to RCVn. The input of each of the receiver circuits RCV1 to RCVn is connected to each of the transmitter circuits HDV1 to HDVn through each of the transmitter and receiver separation switches RTC1 to RTCn that separate the transmitter signal and receiver signal. Each of the receiver circuits RCV1 to RCVn operates using a low voltage power supply as a power supply voltage, receives a receiver signal having a very small voltage amplitude, and amplifies the receiver signal.

As described above, in the Diagnostic Ultrasound System, the transmitter circuits HDV1 to HDVn each output a drive signal having a voltage as high as ±100 V and peripheral components which are low voltage components like the receiver circuits RCV1 to RCVn are connected to each. other through the transmitter and receiver separation switches RTC1 to RTCn. Thus, when a high voltage is erroneously output from the transmitter circuits HDV1 to HDVn upon detection of the reflected wave, the peripheral components may be damaged, which may lead to a serious problem such as breaking.

The following describes the transmitter circuits HDV1 to HDVn. The transmitter circuits HDV1 to HDVn have the same configuration and, thus, only the transmitter circuit HDV1 will be described, and descriptions of other transmitter circuits HDV2 to HDVn will be omitted.

<Basic Configuration of Transmitter Circuit>

FIG. 1 is a block diagram illustrating a basic configuration of the transmitter circuit HDV1 according to the first embodiment. The separation circuit DVD1 is also illustrated in FIG. 1, so that the configuration illustrated in FIG. 1 can be regarded as the transmitter unit illustrated in FIG. 6.

First, a basic configuration of the transmitter circuit HDV1 will be described using FIG. 1. The transmitter circuit HDV1 includes a high voltage driver block (high voltage driver) 2 that outputs a high voltage drive signal and a high voltage driver control block 1 that controls the high voltage driver 2 based on the transmitter signal supplied to the input terminal TI1.

The high voltage driver control block 1 is connected to the power supply terminals TD, TL, TG and TS, and the high voltage driver 2 is connected to the power supply terminals TD, TG, TS, TP and TN. The ground voltage GND (reference voltage) is supplied to the power supply terminal TG. A positive power supply voltage VLL with respect to the ground voltage GND is supplied to the power supply terminal TL, and a positive power supply voltage VDD with respect to the ground voltage GND is supplied to the power supply terminal TD. On the other hand, a negative power supply voltage VSS with respect to the ground voltage GND is supplied to the power supply terminal TS. A positive power supply voltage VPP with respect to the ground voltage GND is supplied to the power supply terminal TP, and a negative power supply voltage VNN with respect to the ground voltage GND is supplied to the power supply terminal TN.

A voltage (potential) of the positive power supply voltage VDD is higher than a voltage of the positive power supply voltage VLL, and a voltage of the positive power supply voltage VPP is higher than a voltage of the positive power supply voltage VDD. An absolute value of a voltage (potential) of the negative power supply voltage VNN is larger than an absolute value of a voltage of the negative power supply voltage VSS. When the positive power supply voltages are compared in absolute value, an absolute value of the voltage (potential) of the positive power supply voltage VDD is larger than an absolute value of the voltage of the positive power supply voltage VLL, and an absolute value of the voltage of the positive power supply voltage VPP is higher than an absolute value of the voltage of the positive power supply voltage VDD.

For example, the power supply voltages assume the following values. Assuming that the ground voltage GND is 0 V, a voltage value of the power supply voltage VLL is +2.5 V to +3.3 V, a voltage value of the power supply voltage VDD is +5 V, a voltage value of the power supply voltage VSS is −5 V, a voltage value of the power supply voltage VPP is 0 V to +100 V, and a voltage value of the power supply voltage VNN is −100 V to 0 V. The absolute values of the power supply voltages VPP and VNN are larger than the absolute values of the power supply voltages VLL, VDD, and VSS. Thus, in the present specification, the power supply voltage VLL is sometimes referred to as a first positive low voltage power supply, power supply voltage VDD is as a second positive low voltage power supply, power supply voltage VSS is as a first negative low voltage power supply, power supply voltage VPP is as a first positive high voltage power supply, and power supply voltage VNN is as a first negative high voltage power supply.

Further, since the ground voltage GND is used as a reference, the ground voltage GND is sometimes referred to as a reference voltage. In this case, the power supply voltage VLL is sometime referred to as a first voltage having a first potential on the positive (first polarity) side with respect to the reference voltage (ground voltage GND), power supply voltage VDD is as a second voltage having a second potential on the positive side with respect to the reference voltage, and power supply voltage VSS is as a third voltage having a third potential on the negative side with respect to the reference voltage. Similarly, the power supply voltage VPP is sometimes referred to as a fourth voltage having a fourth potential on the positive side with respect to the reference voltage, and power supply voltage VNN is as a fifth voltage having a fifth potential on the negative side with respect to the reference voltage.

For making FIG. 1 correspond to FIG. 6, only one input terminal TI1 is illustrated in FIG. 1. However, in the present embodiment, two input terminals are provided. For descriptive convenience, the two input terminals are referred to as input terminals TI1-1 and TI1-2, respectively. From a not illustrated processor, transmitter signal Din1 and Din2 are supplied to the input terminals TI1-1 and TI1-2, respectively.

The high voltage driver control block 1 includes an input circuit 3, a level shift circuit 4 (first level shift circuit), a decoder 5, and a level shift circuit 6 (second level shift circuit). The low power voltages VLL, VDD, and VSS are supplied to the high voltage driver control block 1 having the above circuits through the power supply terminals TL, TD, and TS, and the high voltage driver control block 1 operates using these low power supply voltages as the power supply voltages.

The input circuit 3 is connected to the power supply terminals TG and TL through power supply lines, supplied with the ground voltage GND and power supply voltage VLL, and operates using the power supply voltage VLL as the operating voltage. The input circuit 3 is supplied with the transmitter signals Din1 and Din2 through the external terminals TI1-1 and TI1-2, respectively. Although not especially limited, the input circuit 3 shapes waveforms of the supplied transmitter signals Din1 and Din2 and outputs the resultant signals as signals SS1-1 and SS1-2.

The voltages of the transmitter signals Din1 and Din2 are changed between voltage levels of, e.g., the ground voltage GND and power supply voltage VLL. According to information to be transmitted, the transmitter signals Din1 and Din2 are each changed with the voltage levels of power supply voltage VLL and ground voltage GND as high level and low level, respectively. Further, since the input circuit 3 operates using the power supply voltage VLL as the operating voltage, the signals SS1-1 and SS1-2 output from the input circuit 3 are each changed with the voltage levels of power supply voltage VLL and ground voltage GND as high level and low level, respectively.

The signals SS1-1 and SS1-2 output from the input circuit 3 are supplied to the level shift circuit 4. The level shift circuit 4 receives the signals SS1-1 and SS1-2 as input signals and converts levels of the respective input signals SS1-1 and SS1-2. The level shift circuit 4 is connected to the power supply terminals TG, TL, and TD through power supply lines and supplied with the ground voltage GND, power supply voltage VLL, and power supply voltage VDD. The level shift circuit 4 operates using the power supply voltages VLL and VDD as the operating voltage. That is, the level shift circuit 4 uses these power supply voltages to convert the levels of the input signals SS1-1 and SS1-2 and outputs the resultant signals as signals SS2-1 and SS2-2, respectively.

Since the level shift circuit 4 is supplied with the power supply voltage VDD, the signals SS2-1 and SS2-2 output from the level shift circuit 4 are each changed between the voltage levels of the ground voltage GND and power supply voltage VDD. When the input signals SS1-1 and SS1-2 are at high level (voltage level of the power supply voltage VLL), the level shift circuit 4 converts high level into the voltage level of the power supply voltage VDD and output the resultant signals as high levels of the signals SS2-1 and SS2-2. On the other hand, when the input signals SS1-1 and SS1-2 are at low level (voltage level of the ground voltage GND), the level shift circuit 4 outputs low level as low levels of the signals SS2-1 and SS2-2. That is, the signals SS2-1 and SS2-2 output from the level shift circuit 4 are each changed with the voltage levels of power supply voltage VDD and ground voltage GND as high level and low level, respectively.

The output signals SS2-1 and SS2-2 (first output signals) output from the level shift circuit 4 are supplied to the decoder 5 as input signals. The decoder 5 is connected to the power supply terminals TG and TD through power supply lines and is supplied with the ground voltage GND and power supply voltage VDD. That is, the decoder 5 performs decoding using the power supply voltage VDD as the operating voltage. In the first embodiment, the decoder 5 is supplied with the two input signals SS2-1 and SS2-2, so that four output signals are formed by the decoding. For example, depending on a combination of the two input signals SS2-1 and SS2-2, one of the four output signals becomes high level, and other three output signals becomes low level. The decoder 5 uses the power supply voltage VDD as the operating voltage, so that high level of the output. signal output from the decoder 5 corresponds to a voltage level of the power supply voltage VDD, and low level of the output signal corresponds to a voltage level of the ground voltage GND.

Although not especially limited, two of the four output signals output from the decoder 5 are supplied to the high voltage driver 2, and the other two output signals are supplied to the level shift circuit 6. Although described later, the high voltage driver 2 includes two high breakdown voltage transistors P1 and N1. Based on one of the two output signals output from the decoder 5 to high voltage driver 2, conduction of the high breakdown voltage transistor P1 (first transistor) is controlled, and based on one of the two output signals output from the decoder 5 to level shift circuit 6, conduction of the high breakdown voltage transistor N1 (second transistor) is controlled. In FIG. 1, of the four output signals output from the decoder 5, the output signal for controlling the high breakdown voltage transistor P1 is represented as an output signal SS3-1 (first output signal or second output signal), and output signal for controlling the high breakdown voltage transistor N1 is represented as an output signal SS3-2 (second output signal or third output signal).

The output signals of the decoder 5 other than the output signals SS3-1 and SS3-2 are used for, for example, controlling conduction of a transistor (not illustrated) included in the high voltage driver 2 and controlling the transmitter and receiver separation switch RTC1.

The level shift circuit 6 is connected to the power supply terminals TG, TD, and TS through power supply lines and is supplied with the ground voltage GND, power supply voltage VDD, and power supply voltage VSS through the above power supply terminals. The level shift circuit 6 operates using the power supply voltages VDD and VSS as the operating voltage. That is, the level shift circuit 6 receives from the decoder 5 the output signal SS3-2 as an input signal and uses the power supply voltages GND, VDD, and VSS to convert a level of the input signal SS3-2.

High levels of the output signals SS3-1 and SS3-2 output from the decoder 5 correspond to the voltage level of the power supply voltage VDD, and low levels thereof correspond to the voltage level of the ground voltage GND. The level shift circuit 6 converts high level (voltage level of the power supply voltage VDD) of the output signal (input signal) SS3-2 into the voltage level (high level) of the ground voltage GND and converts low level (voltage level of the ground voltage GND) of the output signal SS3-2 into the voltage level (low level) of the power supply voltage VSS. That is, the level shift circuit 6 converts the output signal SS3-2 whose voltage (potential) is changed between the voltage levels of the ground voltage GND and positive power supply voltage VDD into a signal whose high level corresponds to the voltage level of the ground voltage GND and whose low level corresponds to the voltage level of the negative power supply voltage VSS, to thereby form an output signal SS4 (fourth output signal) whose voltage is changed between the above high and low levels. The output signal SS4 obtained by the level shift operation is supplied from the level shift circuit 6 to high voltage driver 2 as a control signal.

The high voltage driver 2 includes a high voltage level shift circuit 7 (high voltage circuit) and a set of high breakdown voltage transistors P1 and N1. Although not especially limited, the high breakdown voltage transistors P1 and N1 are each constituted of a field effect type transistor. The high breakdown voltage transistor P1 (first transistor) is constituted of a P-channel type field effect transistor (hereinafter, referred to also as a P-channel type transistor or a P-type FET), and high breakdown voltage transistor N1 (second transistor) is constituted of an N-channel type field effect transistor (hereinafter, referred to also as an N-channel type transistor or an N-type FET).

The high voltage level shift circuit 7 is connected to the power supply terminals TG, TD, TS, TP, and TN through power supply lines. The high voltage level shift circuit 7 is supplied with the ground voltage GND and power supply voltages VDD, VSS, VPP, and VNN through the above power supply terminals. The high voltage level shift circuit 7 also operates using the supplied voltages as the operating voltage. The high voltage level shift circuit 7 inverts a phase of the output signal SS3-1 output from the decoder 5 and shifts a level of an output signal obtained by the phase inversion to form a gate drive signal SP1. Further, the high voltage level shift circuit 7 shifts a level of the output signal SS3-2 output from the level shift circuit 6 and outputs the resultant signal as a gate drive signal SN1.

That is, the high voltage level shift circuit 7 phase-inverts the output signal SS3-1 whose high level corresponds to the voltage level of the power supply voltage VDD and whose low level corresponds to the voltage level of the ground voltage GND. Low level (voltage level of the ground voltage GND) of the output signal obtained by the phase inversion is converted into the voltage level of the power supply voltage VPP, and high level (voltage level of the power supply voltage VDD) of the output signal obtained by the phase inversion is converted into the voltage level of the ground voltage GND. As a result, when the output signal SS3-1 is at high level (voltage level of the power supply voltage VDD), a voltage of the gate drive signal SP1 is made to correspond to the voltage level of the ground voltage GND, and when the output signal SS3-1 is at low level (voltage level of the ground voltage GND), the voltage of the gate drive signal SP1 is made to correspond to the voltage level of the power supply voltage VPP.

Further, the high voltage level shift circuit 7 converts a voltage of the gate drive signal SN1 into the voltage level of the ground voltage GND when the output signal SS4 from the level shift circuit 6 is at high level (voltage level of the ground voltage GND) and converts the voltage of the gate drive signal SN1 into the voltage level of the power supply voltage VNN when the output signal SS4 is at low level (voltage level of the power supply voltage VSS). That is, when the output signal SS4 is at high level (voltage level of the ground voltage GND), the gate drive signal SN1 corresponds to the voltage level of the ground voltage GND, and when the output signal SS4 is at low level (voltage level of the power supply voltage VSS), the gate drive signal SN1 corresponds to the voltage level of the power supply voltage VNN.

A source of the P-type FET P1 is connected to the power supply terminal TP through a power supply line, and a source of the N-type FET N1 is connected to the power supply terminal TN through a power supply line. Drains of the P-type FET P1 and N-type FET N1 are connected to a node nd. A gate of the P-type FET P1 is supplied with the gate drive signal SP1 from the high voltage level shift circuit 7, and a gate of the N-type FET N1 is supplied with the gate drive signal SN1 from the high voltage level shift circuit 7. That is, current paths of the respective P-type FET P1 and N-type FET N1 are connected in series between the power supply terminals TP and TN, and a connecting part of the P-type FET P1 and N-type FET N1 is the node nd. The separation circuit DVD1 is connected between the node nd and input/output terminal TU1.

When the output signal SS3-1 from the decoder 5 is at high level, the voltage of the gate drive signal SP1 is made to correspond to the voltage level of the ground voltage GND, with the result that the P-type FET P1 is made conductive, causing current to be supplied from the power supply voltage VPP to node nd through the P-type FET P1. On the other hand, when the output signal SS3-1 is at low level, the voltage of the gate drive signal SP1 is made to correspond to the voltage level of the power supply voltage VPP, with the result that the P-type FET P1 is made non-conductive, and current does not flow from the power supply voltage VPP to node nd.

When the output signal SS4 from the level shift circuit 6 is at high level, the voltage of the gate drive signal SN1 is made to correspond to the voltage level of the ground voltage GND, with the result that the N-type FET N1 is made conductive, causing current to be supplied from the node nd to power supply voltage VNN. On the other hand, when the output signal SS4 is at low level, the voltage of the gate drive signal SN1 is made to correspond to the voltage level of the power supply voltage VNN, with the result that the N-type FET N1 is made non-conductive, and current does not flow from the node nd to power supply voltage VNN.

Thus, it can be considered that conduction of the P-type FET P1 and N-type FET N1 is controlled by the high voltage level shift circuit 7. Further, in terms of the high voltage driver 2, it can be considered that the high voltage driver 2 selectively outputs the high voltage power supply voltage VPP and high voltage power supply voltage VNN according to the output signals SS3-1 and SS4.

A processor not illustrated changes the voltages of the transmitter signals Din1 and Din2 with a lapse of time and, accordingly, the output signals SS1-1 and SS1-2 are also each changed between high and low levels with a lapse of time. Accordingly, the output signals SS2-1 and SS2-2 obtained by level shift of the output signals SS1-1 and SS1-2 are also each changed between high and low levels with a lapse of time. The change of the each of the output signals SS2-1 and SS2-2 between high and low levels with a lapse of time causes the output signals SS3-1 and SS3-2 output from the decoder 5 to alternately become high level. The level shift circuit 6 level-shifts the output signal SS3-2 from the decoder 5 and outputs the resultant signal as the output signal SS4. As a result, the output signals SS3-1 and SS4 alternately becoming high level are supplied also to the high voltage level shift circuit 7. This causes the P-type FET P1 and N-type FET N1 to be alternately made conductive, with the result that the power supply voltages VPP and VNN are alternately output from the node nd.

Although not limited, the separation circuit DVD1 includes a pair of diode elements D1 and D2. Anodes and cathodes of the diode elements D1 and D2 are cross-connected so as to constitute a bidirectional switch. Thus, when a voltage of the node nd with respect to the voltage of the input/output terminal TU1 exceeds a forward voltage of the diode elements D1 and D2, the high voltage of the node nd is applied to the ultrasound oscillator HB1 illustrated in FIG. 6. Alternate conduction of the P-type FET P1 and N-type FET N1 causes the voltage of the node nd to become a voltage that is changed according to the high voltage power supply voltage VPP or VNN, so that the high voltage (power supply voltage VPP or VNN) from the high voltage driver 2 is applied to the ultrasound oscillator HB1 through the separation circuit DVD1 to generate an ultrasound wave.

When the ultrasound oscillator HB1 receives a reflected wave, a voltage of the detection signal generated by the ultrasound oscillator HB1 is very low and thus does not exceed the forward voltage of the diode elements D1 and D2. Therefore, the detection signal from the ultrasound oscillator HB1 is not transmitted to the node nd through the separation circuit DVD1. For example, the high voltage driver 2 may be provided with a not illustrated transistor so as to make the voltage of the node nd be a predetermined voltage value upon receiver of the reflected wave. This transistor may be connected between, for example, the node nd and a predetermined voltage, and conduction thereof may be controlled by an output signal from the decoder 5. Since the four output signals are output from the decoder 5 as described above, an output signal other than the output signals SS3-1 and SS3-2 may be used to control conduction of the transistor.

In the high voltage level shift circuit 7, the voltages of the gate drive signals SP1 and SN1 are converted into the ground voltage GND and power supply voltage VPP, and ground voltage GND and power supply voltage VNN, respectively; however, the present invention is not limited to this. For example, the voltages of the gate drive signals SP1 and SP2 may be converted into the voltage levels of the power supply voltages VPP and VNN, respectively. Further, in the above description, the output signal SS3-1 is phase-inverted, and then level shift. is performed; however, the present invention is not limited to this. Further, in the above description, two transmitter signals (Din1 and Din2) are used; however, the present invention is not limited to this.

<Configuration of Transmitter Circuit>

Figure 2:
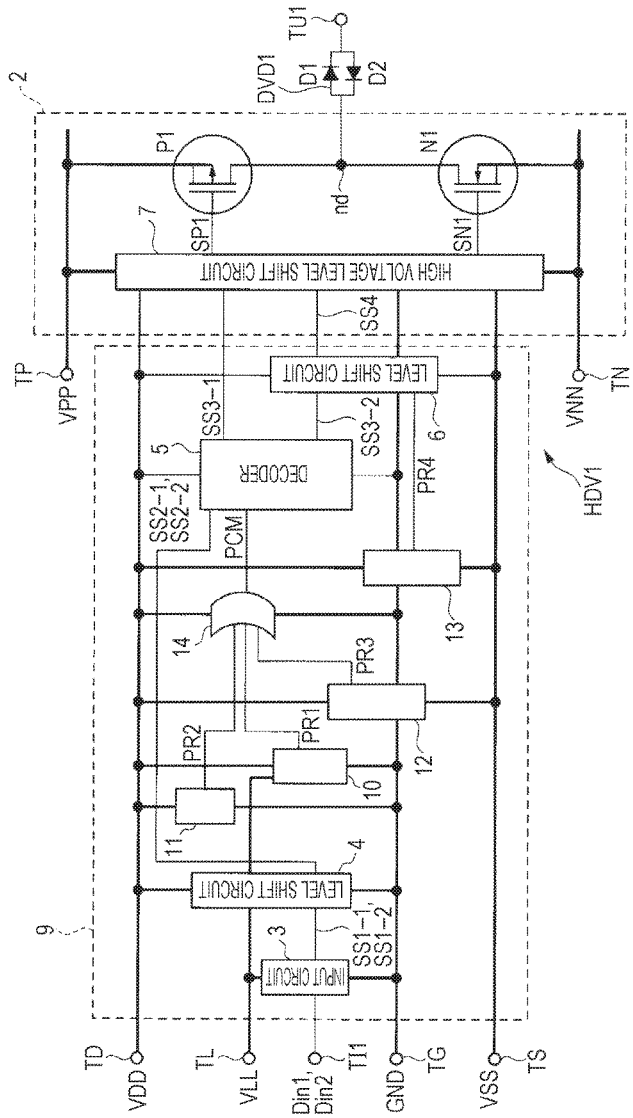
FIG. 2 is a block diagram illustrating a configuration of the transmitter circuit according to the first embodiment.

FIG. 2 is a block diagram illustrating a configuration of the transmitter circuit HDV1 according to the first embodiment. The transmitter circuit of the embodiment includes a plurality of power-on reset circuits and a logic circuit so as to prevent the P-type FET P1 and/or N-type FET N1 which is an output transistor from being made conductive when an absolute value of the voltage (amplitude with respect to the ground voltage GND) of the power supply voltage of at least one of the power supply voltages VLL, VDD, and VSS becomes small.

The configuration of the transmitter circuit HDV1 illustrated in FIG. 2 is similar to the basic configuration of the transmitter circuit illustrated in FIG. 1. In FIG. 2, a reference numeral 2 denotes a high voltage driver block, and DVD1 denotes a separation circuit. Configurations and operations of the high voltage driver block 2 and separation circuit DVD1 illustrated in FIG. 2 are the same as those of the high voltage driver block 2 and separation circuit DVD1 illustrated in FIG. 1. Thus, descriptions of the high voltage driver block 2 and separation circuit DVD1 will be omitted in principle.

Further, in FIG. 2, a reference numeral 9 denotes a high voltage driver control block. The high voltage driver control block 9 is similar to the high voltage driver control block 1. That is, the input circuit 3, level shift circuit 4, input terminal TI1, and power supply terminals TD, TL, TG, and TS included in the high voltage driver control block 1 of FIG. 1 are the same as those included in the high voltage driver control block 9 of FIG. 2. The transmitter circuit HDV1 of FIG. 2 differs from that of FIG. 1 in that first to fourth power-on reset circuits 10 to 13 and a logic circuit 14 are added to the high voltage driver control block 9 and that configurations of decoder 5 and level shift circuit 6 are changed. Thus, hereinafter, descriptions will be made mainly on the first to fourth. power-on reset circuits 10 to 13, logic circuit 14, decoder 5, and level shift circuit 6.

The first power-on reset circuit 10 is connected to the power supply terminals TG, TD, and TL through power supply lines. That is, the first power-on reset circuit 10 is supplied with the ground voltage GND, power supply voltage VDD, and power supply voltage VLL. The first power-on reset circuit 10 detects whether or not the voltage of the power supply voltage VLL has been reduced to equal to or less than a predetermined value (first value). In other words, the first power-on reset circuit 10 detects whether or not an absolute value of the voltage (potential) of the power supply voltage VLL has been reduced to equal to or less than a predetermined value (first value). The first power-on reset circuit 10 outputs a detection result on a reset signal PR1 (first reset signal). High level of the reset signal PR1 corresponds to the voltage level of the power supply voltage VDD, and low level thereof corresponds to the voltage level of the ground voltage GND. The first power-on reset circuit 10 sets the reset signal PR1 to high level when the voltage of the power supply voltage VLL is reduced to equal to or less than a predetermined value and sets the same to low level when the voltage of the power supply voltage VLL is larger than the predetermined value.

The second power-on reset circuit 11 is connected to the power supply terminals TG and TD through power supply lines. That is, the second power-on reset circuit 11 is supplied with the ground voltage GND and power supply voltage VDD. The second power-on reset circuit 11 detects whether or not the voltage of the power supply voltage VDD has been reduced to equal to or less than a predetermined value (second value). In other words, the second power-on reset circuit 11 detects whether or not an absolute value of the voltage (potential) of the power supply voltage VDD has been reduced to equal to or less than a predetermined value (second value). The second power-on reset circuit 11 outputs a detection result on a reset signal PR2 (second reset signal). High level of the reset signal PR2 corresponds to the voltage level of the power supply voltage VDD, and low level thereof corresponds to the voltage level of the ground voltage GND. The second power-on reset circuit 11 sets the reset signal PR2 to high level when the voltage of the power supply voltage VDD is reduced to equal to or less than a predetermined value and sets the same to low level when the voltage of the power supply voltage VDD is larger than the predetermined value.

The third power-on reset circuit 12 is connected to the power supply terminals TG, TD and TS through power supply lines. That is, the third power-on reset circuit 12 is supplied with the ground voltage GND, power supply voltage VDD, and power supply voltage VSS. The third power-on reset circuit 12 detects whether or not the voltage of the power supply voltage VSS has been increased to a predetermined value (third value) or more. The power supply voltage VSS has a negative potential with respect to the ground voltage GND. Therefore, when the power supply voltage is represented by an absolute value, the third power-on reset circuit 12 detects also whether or not an absolute value of the voltage (potential) of the power supply voltage VSS has been reduced to equal to or less than a predetermined value (third value). The third power-on reset circuit 12 outputs a detection result on a reset signal PR3 (third reset signal). High level of the reset signal PR3 corresponds to the voltage level of the power supply voltage VDD, and low level thereof corresponds to the voltage level of the ground voltage GND. The third power-on reset circuit 12 sets the reset signal PR3 to high level when the absolute value of the voltage of the power supply voltage VSS is reduced to equal to or less than a predetermined value and sets the same to low level when the absolute value of the voltage of the power supply voltage VSS is larger than the predetermined value.

The fourth power-on reset circuit 13 is connected to the power supply terminals TG, TD, and TS through power supply lines. That is, the fourth power-on reset circuit 13 is supplied with the ground voltage GND, power supply voltage VDD, and power supply voltage VSS. The fourth power-on reset circuit 13 detects whether or not the voltage of the power supply voltage VDD has been reduced to equal to or less than a predetermined value (fourth value). In other words, the fourth power-on reset circuit 13 detects whether or not an absolute value of the voltage (potential) of the power supply voltage VDD has been reduced to equal to or less than a predetermined value (fourth value). The fourth power-on reset circuit 13 outputs a detection result on a reset signal PR4 (fourth reset signal). High level of the reset signal PR4 corresponds to the voltage level of the ground voltage GND, and low level thereof corresponds to the voltage level of the power supply voltage VSS. The fourth power-on reset circuit 13 sets the reset signal PR4 to low level when the voltage of the power supply voltage VDD is reduced to equal to or less than a predetermined value and sets the same to high level when the voltage of the power supply voltage VDD is larger than the predetermined value.

The reset signals PR1, PR2, and PR3 output, respectively, from the first power-on reset circuit 10, second power-on reset circuit 11, and third power-on reset circuit 12 are input to the logic circuit 14 that performs OR operation. Thus, when at least one of the reset signals PR1, PR2, and PR3 becomes high level, the logic circuit 14 outputs a high level synthesized reset signal PCM. That is, when the absolute value of at least one of the power supply voltages VLL, VDD, and VSS becomes equal to or less than a predetermined value (first, second, or third value), the synthesized reset signal PCM becomes high level. The logic circuit 14 is connected to the power supply terminals TD and TG and operates using the power supply voltage VDD as the operating voltage. High level of the synthesized reset signal PCM corresponds to, e.g., the voltage level of the power supply voltage VDD, and low level thereof corresponds to the voltage level of the ground voltage GND. As a matter of course, when all the reset signals PR1 to PR3 are at low level, the synthesized reset signal PCM becomes low level.

The synthesized reset signal PCM is supplied to the decoder 5. When the synthesized reset signal PCM is at low level, the decoder 5 performs the same operation as the decoder 5 illustrated in FIG. 1 does. That is, the decoder 5 decodes the output signals SS2-1 and SS2-2 from the level shift circuit 4 and outputs a result of the decoding. On the other hand, when the synthesized reset signal PCM is at high level, the decoder 5 assumes a predetermined state in response to the high level synthesized reset signal PCM. That is, the decoder 5 is controlled to a state where it outputs the output signals SS3-1 and SS3-2 that make the respective P-type FET P1 and N-type FET N1 non-conductive. In the first embodiment, the decoder 5 is put into a state where it sets both the output signals SS3-1 and SS3-2 to low level.

Figure 7:
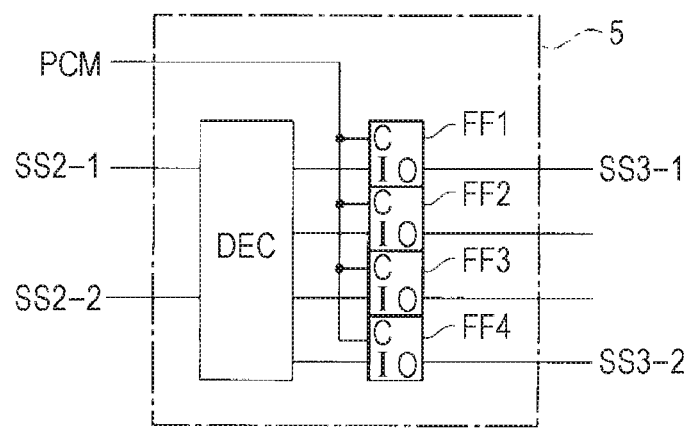
FIG. 7 is a block diagram illustrating a decoder according to the first embodiment.

FIG. 7 is a block diagram illustrating a configuration of the decoder 5 according to the first embodiment. The decoder 5 includes a decoder circuit DEC and flip-flop circuits FF1 to FF4. The decoder circuit DEC decodes the output signals SS2-1 and SS2-2 from the level shift circuit 4. The flip-flop circuits FF1 to FF4 each include a data input terminal I, a clear terminal C, and a data output terminal O.

The decoding results obtained by the decoder circuit DEC are supplied to the data input terminals I of the corresponding flip-flop circuits FF1 to FF4. Further, the clear terminals C of the respective flip-flop circuits FF1 to FF4 are supplied with the synthesized reset signal PCM.

When the synthesized reset signal PCM supplied to the clear terminal C is at low level, each of the flip-flop circuits FF1 to FF4 outputs, from the data output terminal O, the output of the decoder circuit DEC supplied to the data input terminal I. On the other hand, when the synthesized reset signal PCM supplied to the clear terminal C is at high level, each of the flip-flop circuits FF1 to FF4 outputs low level from the data output terminal O, irrespective of the output of the decoder circuit DEC.

Thus, when the synthesized reset signal PCM is at low level, the output signal SS3-1 at high level or low level and output signal SS3-2 at high level or low level are output from the data output terminals O of the flip-flop circuits FF1 and FF4, respectively, in accordance with results of decoding of the output signals SS2-1 and SS2-2. On the other hand, when the synthesized reset signal PCM is at high level, the output signals SS3-1 and SS3-2 at low level are output from the output terminals O of the respective flip-flop circuits FF1 and FF4. In this manner, when the synthesized reset signal PCM is at high level, the decoder 5 is put into a predetermined state. The decoder circuit DEC and flip-flop circuits FF1 to FF4 operate using the power supply voltage VDD as the operating voltage, and high level thereof corresponds to the voltage level of the power supply voltage VDD and low level thereof corresponds to the voltage level of the ground voltage GND.

Although the flip-flop circuits FF1 to FF4 are configured to receive the outputs of the decoder circuit DEC in FIG. 7, the present invention is not limited to this. For example, the flip-flop circuits FF1 and FF2 may be provided on the input side of the decoder circuit DEC. Also in this case, the flip-flop circuits FF1 and FF2 are cleared by the synthesized reset signal PCM, and the output signals SS3-1 and SS3-2 are set to low level. Further, the flip-flop circuit need not be provided in the decoder 5. In this case, a clear terminal is provided in the decoder circuit DEC, and the synthesized reset signal PCM is supplied to the decoder circuit DEC through the clear terminal. When the high level synthesized reset signal PCM is supplied to the clear terminal, the decoder circuit DEC sets the output signals SS3-1 and SS3-2 to low level.

When the absolute value of the voltage of at least one of the power supply voltages VLL, VDD, and VSS becomes equal to or less than a predetermined value, the output signals SS3-1 and SS3-2 of the decoder 5 becomes low level (ground voltage GND).

When the output signal SS3-1 becomes low level, the high voltage level shift circuit 7 makes the voltage of the gate drive signal SP1 correspond to the voltage level of the power supply voltage VPP, as described using FIG. 1. As a result, the P-type FET P1 is made non-conductive.

Further, when the output signal SS3-2 becomes low level, the level shift circuit 6 level-shifts the output signal SS3-2 and outputs a low level signal as the output signal SS4 having a voltage level of the power supply voltage VSS.

The source of the N-type FET N1 is supplied with a voltage of up to −100 V as the power supply voltage VNN. Therefore, in order to make the N-type FET N1 non-conductive, it is necessary to make the voltage of the gate drive signal SN1 negative. Thus, in the first embodiment, the ground voltage GND corresponding to low level of the output signal SS3-2, which is output from the decoder 5, is level-converted into a voltage level of the negative power supply voltage VSS by the level shift circuit 6, and the low level output from the level shift circuit 6 is level-converted into up to a voltage level of the negative power supply voltage VNN by the high voltage level shift circuit 7. That is, the gate drive signal SN1 is converted into a negative high voltage in a plurality of steps. This can reduce a burden involved in the level conversion.

A configuration example of the level shift circuit 6 will be described later using FIG. 3. When the absolute value of the voltage of the power supply voltage VDD becomes equal to or less than a predetermined value, operation of the level shift circuit 6 may become unstable, which may cause malfunction. In the first embodiment, the level shift circuit 6 is put into a predetermined state by the reset signal PR4 from the fourth power-on reset circuit 13, thereby preventing occurrence of malfunction associated with unstable operation of the level shift circuit 6.

When the absolute values of both the power supply voltage VLL and power supply voltage VSS become equal to or less than a predetermined value or when the absolute value of the power supply voltage VLL or power supply voltage VSS becomes equal to or less than a predetermined value, the level shift circuit 6 operates stably. Thus, when the absolute value of at least one of the power supply voltage VLL and power supply voltage VSS becomes equal to or less than a predetermined value, the low level output signal SS3-2 from the decoder 5 is subjected to level conversion by the level shift circuit 6. By this level conversion, the output signal SS4 having a voltage level of the power supply voltage VSS is supplied to the high voltage level shift circuit 7 from the level shift circuit 6. Thus, as described using FIG. 1, the high voltage level shift circuit 7 outputs the gate drive signal SN1 having a voltage of the power supply voltage VNN. As a result, the N-type FET N1 is also made non-conductive.

Thus, when the absolute value of at least one of the power supply voltage VLL and power supply voltage VSS becomes equal to or less than a predetermined value, both the P-type FET P1 and N-type FET N1 are made non-conductive, thereby making it possible to prevent a short-circuit or erroneous output of a high voltage.

<Configuration of Level Shift Circuit>

Figure 3:
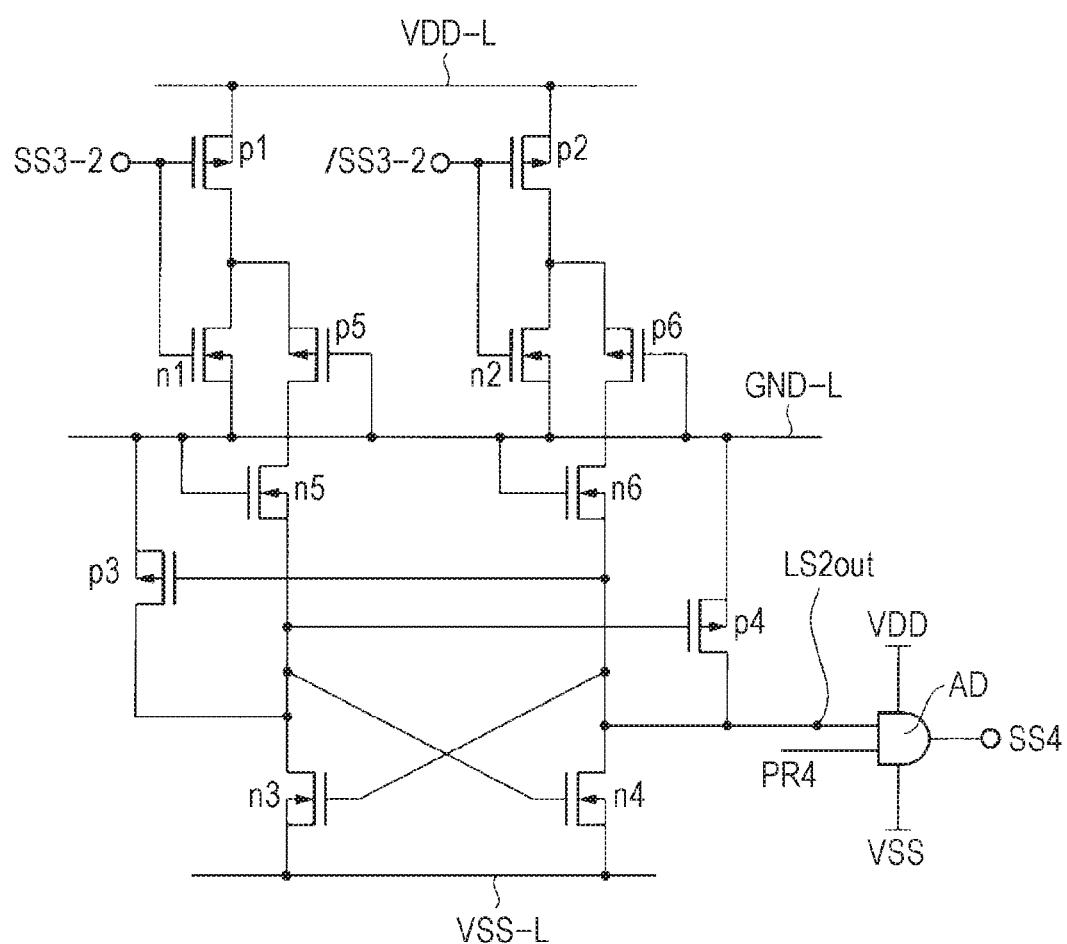
FIG. 3 is a circuit diagram illustrating a configuration of a level shift circuit according to the first embodiment.

The following describes using FIG. 3 a configuration of the level shift circuit 6 according to the first embodiment. FIG. 3 is a circuit diagram illustrating a configuration of the level shift circuit 6.

The level shift circuit. 6 includes P-type FETs p1 to p6, N-type FETs n1 to n6, and a two-input AND circuit AD. In FIG. 3, VDD-L denotes a power supply line connecting the level shift circuit 6 and power supply terminal TD, VSS-L denotes a power supply line connecting the level shift circuit 6 and power supply terminal TS, and GND-L denotes a power supply line connecting the level shift circuit 6 and power supply terminal TG. Accordingly, the power supply line VDD-L is supplied with the power supply voltage VDD, power supply line VSS-L is supplied with the power supply voltage VSS, and power supply line GND-L is supplied with the ground voltage GND.

Sources of the P-type FETs p1 and p2 are connected to the power supply line VDD-L, sources of the N-type FETs n1 and n2 are connected to the power supply line GND-L, and drains of the P-type FETs p1 and p2 are connected, respectively, to drains of the N-type FETs n1 and n2. Gates of the P-type FET p1 and N-type FET n1 are connected in common and are supplied with the output signal SS3-2 from the decoder 5. Gates of the P-type FET p2 and N-type FET n2 are also connected in common and are supplied with an inversion signal /SS3-2 obtained by inverting a phase of the output signal SS3-2.

Sources of the P-type FETs p3 and p4 are connected to the power supply line GND-L, and sources of the N-type FETs n3 and n4 are connected to the power supply line VSS-L. Drains of the P-type FETs p3 and p4 are connected, respectively, to drains of the N-type FETs n3 and n4. Gates of the P-type FET p3 and N-type FET n3 are connected in common to the drains of the P-type FET p4 and N-type FET n4. Gates of the P-type FET p4 and N-type FET n4 are connected in common to the drains of the P-type FET p3 and N-type FET n3.

That is, the P-type FET p3 and N-type FET n3 constitute a first inverter circuit, and the P-type FET p4 and N-type FET n4 constitute a second inverter circuit. An input of the first inverter circuit (p3, n3) is connected to an output of the second inverter circuit (p4, n4), and an input of the second inverter circuit is connected to an output of the first inverter circuit. As a result, so-called a latch circuit is constituted by the first and. second inverter circuits.

In the first embodiment, the input (gates of p3 and n3) of the first inverter circuit is connected to a source of the N-type FET n6 whose gate is connected to the power supply line GND-L. A drain of the N-type FET n6 is connected to a drain of the P-type FET p6 whose gate is connected to the power supply line GND-L. A source of the P-type FET p6 is connected to the drains of the P-type FET p2 and N-type FET n2. Similarly, the input (gates of p4 and n4) of the second inverter circuit is connected to a source of the N-type FET n5 whose gate is connected to the power supply line GND-L. A drain of the N-type FET n5 is connected to a drain of the P-type FET p5 whose gate is connected to the power supply line GND-L. A source of the P-type FET p5 is connected to the drains of the P-type FET p1 and N-type FET n1.

The P-type FET p1 and N-type FET n1 constitute a third inverter circuit that operates using the power supply voltage VDD and ground voltage GND as the operating voltage. Similarly, the P-type FET p2 and N-type FET n2 constitute a fourth inverter circuit that operates using the power supply voltage VDD and ground voltage GND as the operating voltage. The third inverter circuit (p1, n1) phase-inverts the output signal SS3-2 and outputs the voltage level of the power supply voltage VDD or ground voltage GND. The output voltage of the third inverter circuit is supplied to the input of the second inverter circuit (p4, n4) through the P-type FET p5 and N-type FET n5. Similarly, the fourth inverter circuit (p2, n2) phase-inverts the inversion signal /SS3-2 and outputs the voltage level of the power supply voltage VDD or ground voltage GND. The output voltage of the fourth inverter circuit is supplied to the input of the first inverter circuit (p3, n3) through the P-type FET p6 and N-type FET n6.

That is, based on the output signal SS3-2 and inversion signal /SS3-2, a voltage changed between the voltage levels of the power supply voltage VDD and ground voltage GND is supplied to the input of the latch circuit through the P-type FET and N-type FET whose gates are supplied with the ground voltage GND. The latch circuit holds a state according to the supplied voltage, and a voltage of a node LS2out is made to correspond to the voltage level of the power supply voltage VSS or ground voltage GND according to the voltage of the output signal SS3-2.

For example, when the output signal SS3-2 is at the voltage level (high level) of the power supply voltage VDD, the N-type FET n1 and P-type FET p2 are made conductive, causing the voltage level of the power supply voltage VDD to be supplied to the input of the first inverter circuit through the P-type FET p6 and N-type FET n6. At this time, the voltage level of the ground voltage GND is supplied to the input of the second inverter circuit through the P-type FET p5 and N-type FET n5. As a result, the output of the first inverter circuit is made to correspond to the voltage level of the power supply voltage VSS, and output of the second inverter circuit is made to correspond to the voltage level of the ground voltage GND. This state is retained in the latch circuit, making the voltage of the node LS2out correspond to the ground voltage GND (high level).

On the other hand, when the output signal SS3-2 is at the voltage level (low level) of the ground voltage GND, the N-type FET n2 and P-type FET p1 are made conductive, causing the voltage level of the power supply voltage VDD to be supplied to the input of the second inverter circuit through the P-type FET p5 and N-type FET n5. At this time, the voltage level of the ground voltage GND is supplied to the input of the first inverter circuit through the P-type FET p6 and N-type FET n6. As a result, the output of the second inverter circuit is made to correspond to the voltage level of the power supply voltage VSS, and output of the first inverter circuit is made to correspond to the voltage level of the ground voltage GND. This state is retained in the latch circuit, making the voltage of the node LS2out correspond to the voltage level of the power supply voltage VSS (low level).

Thus, the output signal SS3-2 whose high level corresponds to the power supply voltage VDD and whose low level corresponds to the ground voltage GND is level-converted into a signal whose high level corresponds to the ground voltage GND and whose low level corresponds to the voltage level of the negative power supply voltage VSS.

By supplying the output voltages of the third and fourth inverter circuits to the latch circuit through the P-type FETs p5 to p6 whose gates are connected to the ground voltage GND and N-type FETs n5 to n6 whose gates are connected to the ground voltage GND, it is possible to prevent occurrence of reverse current in the third and fourth inverter circuits.

For example, assume that a state where the node LS2out is being at the ground voltage GND is retained by the latch circuit. In this state, when the voltage of the power supply voltage VDD in the power supply line VDD-L becomes equal to or less than a predetermined value, that is, when the absolute value of the voltage of the power supply voltage VDD becomes equal to or less than a predetermined value, the synthesized reset signal PCM from the logic circuit 14 becomes high level and, accordingly, the decoder 5 is put into a predetermined state, as described above. The decoder 5 put into a predetermined state makes the output signals SS3-1 and SS3-2 low level. When the output signal SS3-2 becomes low level, the P-type FET p1 is made conductive; however, since the voltage of the power supply voltage VDD is equal to or less than a predetermined value, the level of the voltage to be supplied to the input of the second inverter circuit is reduced. This may made the latch circuit unstable. This may cause, for example, a state where the voltage of the node LS2out is being at the ground voltage GND to be continued. That is, it may be impossible to change the state of the latch circuit.

When the voltage of the node LS2out is maintained at the ground voltage GND (high level) and not changed to the voltage level of the power supply voltage VSS (low level), the N-type FET N1 in the high voltage driver 2 continues its conductive state even though the voltage of the power supply voltage VDD becomes equal to or less than a predetermined value, with the result that the power supply voltage VNN which is a negative high voltage is output from the transmitter circuit HDV1.

In the first embodiment, the two-input AND circuit AD is provided in the level shift circuit 6. One output of the AND circuit AD is connected to the node LS2out, and the other output thereof is supplied with the reset signal PR4. An output of the AND circuit AD is supplied to the high voltage level shift circuit 7 as the above-mentioned output signal SS4. The AND circuit AD is supplied with the ground voltage GND and power supply voltage VES and operates using these voltages as the operating voltage. That is, the output signal SS4 output from the AND circuit AD is a signal whose high level corresponds to the voltage level of the ground voltage GND and whose low level corresponds to the voltage level of the power supply voltage VSS.

As described using FIG. 2, when the voltage of the power supply voltage VDD becomes equal to or less than a predetermined value, the fourth power-on reset circuit 13 outputs the low level reset signal PR4 having a voltage level of the power supply voltage VSS. Thus, when the voltage of the power supply voltage VDD becomes equal to or less than a predetermined value, low level is supplied to the other input of the AND circuit AD, with the result that the output signal SS4 of the AND circuit. AD becomes low level (voltage level of the power supply voltage VSS). As a result, the N-type FET N1 is made non-conductive. Thus, even when the absolute value of the voltage of the power supply voltage VDD becomes equal to or less than a predetermined value, the power supply voltage VNN which is a negative high voltage can be prevented from being output through the N-type FET N1.

In other words, when the absolute value of the voltage of the power supply voltage VDD becomes equal to or less than a predetermined value, the level shift circuit 6 is forced into a predetermined state by the fourth power-on reset circuit 13, where it outputs the output signal SS4 having a level that makes the N-type FET N1 in the high voltage driver 2 non-conductive irrespective of the output. of the decoder 5. That is, even being in an unstable state, the latch circuit in the level shift circuit 6 allows the output signal SS4 having a level that makes the transistor in the high voltage driver 2 non-conductive to be output from the level shift circuit 6. The AND circuit AD can be regarded as a limiting circuit that forcibly limits the potential of the output signal SS4 to low level (voltage level of the power supply voltage VSS) according to the reset signal PR4.

As described above, according to the first embodiment, in the high voltage driver 2, it is possible to prevent a short circuit between the positive high voltage (VPP) and negative high voltage (VNN) which may occur when the absolute value of at least one of the plurality of types of power supply voltages (VDD, VSS, and VLL) including positive and negative voltages supplied to the transmitter circuit HDV1 as the operating voltage becomes equal to or less than a predetermined value. Further, it is possible to prevent the positive or negative high voltage from being erroneously output from the high voltage driver 2.

Since it is possible to prevent the high voltage from being erroneously output, it is possible to prevent peripheral components such as the receiver circuit RCV1 from being damaged or broken. This also can prevent development of the Diagnostic Ultrasound System from being delayed.

Upon application of a plurality of power supply voltages to the pulser semiconductor device CHP, they are applied in the ascending order of the absolute value so as to prevent the malfunction, damage, or the like. Specifically, the power supply voltages are applied in the order of the ground voltage GND, power supply voltage VLL, power supply voltages VDD and VSS, and power supply voltages VPP and VNN which are high voltages. In the first embodiment, it is possible to prevent a high voltage from being output from the high voltage driver 2, i.e., pulser semiconductor device when the absolute value of at least one of the plurality of types of power supply voltages (VDD, VSS, and VLL) becomes equal to or less than a predetermined value. This can enhance a degree of freedom in the application order of the power supplies.

In the first embodiment, the low level output signals SS3-1, SS3-2, and SS4 are output from the decoder 5 and level shift circuit 6 in order to make the N-type FET N1 and P-type FET P1 in the high voltage driver 2 non-conductive; however, the present invention is not limited to this. For example, a configuration may be possible, in which the N-type FET N1 and P-type FET P1 are made non-conductive when the output signals SS3-1, SS3-2, and SS4 are at high level. In this case, for example, the configuration of the high voltage level shift circuit 7 (high voltage circuit) may be changed so as to make the N-type FET N1 and P-type FET P1 non-conductive when the output signals SS3-1, SS3-2, and SS4 are at high level. Further, the logic circuit constituting the synthesized reset signal PCM is not limited to a logic circuit that performs OR operation.

The first to fourth power-on reset circuits 10 to 13 may each have various configurations as long as they can detect whether or not the absolute value of the voltage of the power supply voltage is equal to or less than a predetermined value and output a detection signal (reset)signal. The predetermined value serving as a reference when the first to third power-on reset circuits 10 to 12 perform the detection are different from each other since the polarity and voltage value of the power supply voltage to be detected by the power-on reset circuits are different. The fourth power-on reset circuit 13 and second power-on reset circuit 11 detect the same power supply voltage (VDD). Therefore, the fourth power-on reset circuit 13 and second power-on reset circuit 11 may use the same value as the predetermined value to detect whether or not the voltage of the power supply voltage VDD is equal to or less than the predetermined value. As a matter of course, the fourth power-on reset circuit 13 and second power-on reset circuit 11 may use different values as the predetermined value to be used as a reference.

The level shift circuit 4 may have various configurations as long as it can perform the level conversion. The configuration of the level shift circuit 6 is also not limited to that illustrated in FIG. 3 and may have various configurations as long as it has the latch circuit.

In the first embodiment, the output signal SS3-2 form the decoder 5 is level-converted by the level shift circuit 6 and, based on the output signal SS4 obtained by the level conversion, conduction of the N-type FET N1 is controlled. However, a level shift circuit having the same configuration as that of the level shift circuit 6 may be provided for the output signal SS3-1 from the decoder 5. In this case, conduction of the P-type FET P1 is controlled based on an output signal obtained through the level conversion performed by the newly provided level shift circuit.

The transmitter circuit or peripheral components can be prevented from being damaged or broken by the first to fourth power-on reset circuits 10 to 13 and logic circuit 14, so that it can be considered that the first to fourth power-on reset circuits 10 to 13 and logic circuit constitute a protective circuit. Further, from a viewpoint that the damage or breaking is prevented by the level shift circuit provided with the latch circuit, it can be considered that a first protective circuit is constituted. by the first to third power-on reset circuits 10 to 12 and logic circuit 14, and a second protective circuit is constituted by the fourth power-on reset circuit 13.

In this case, when the absolute value of at least one of the power supply voltages VLL, VDD and VSS becomes equal to or less than a predetermined value, the decoder 5 is controlled by the first protective circuit so as to output the output signals SS3-1 and SS3-2 having levels that make the respective transistors P1 and N1 non-conductive. Further, when the absolute value of the potential of the power supply voltage VDD becomes equal to or less than a predetermined value, the level shift circuit 6 is controlled by the second protective circuit so as to output the output signal SS4 having a level that makes the transistor Ni non-conductive.

Second Embodiment

Figure 4:
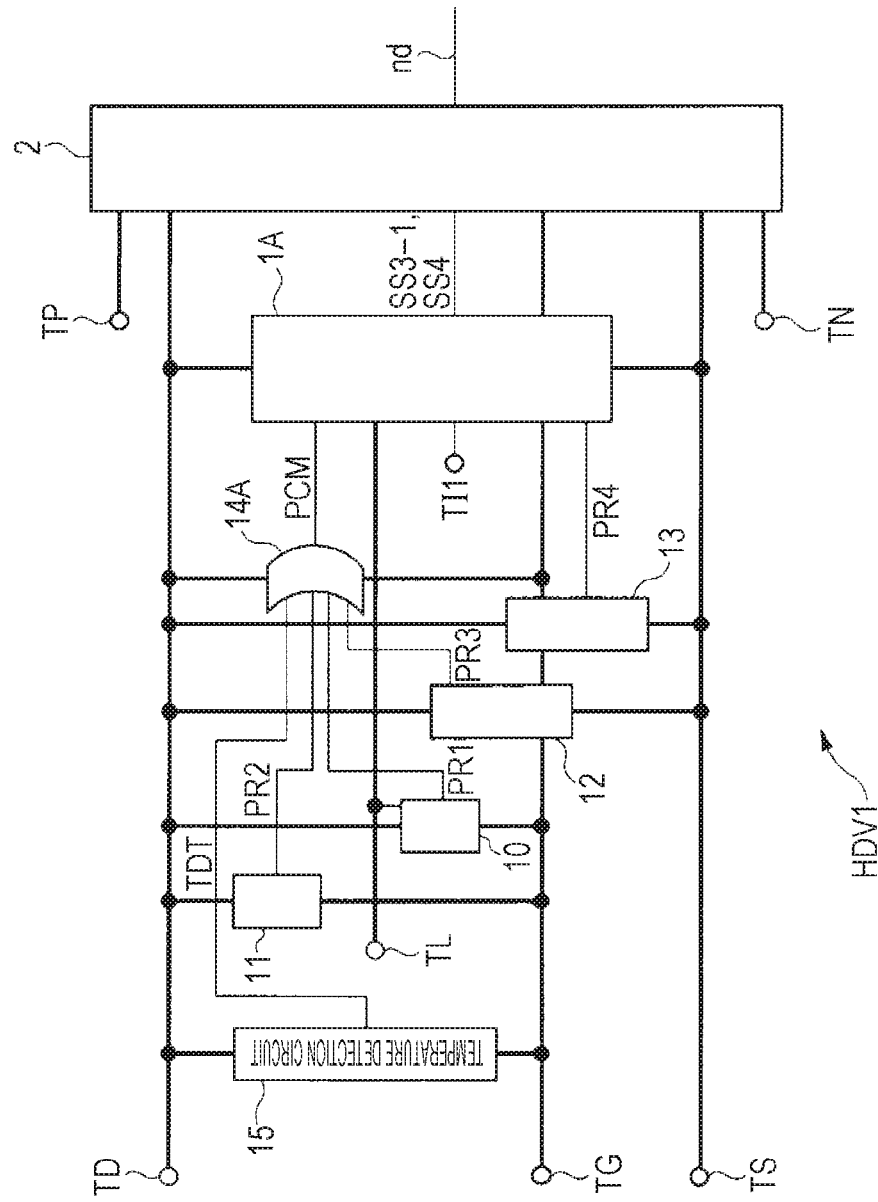
FIG. 4 is a block diagram illustrating a configuration of a transmitter circuit according to a second embodiment.

FIG. 4 is a block diagram illustrating a configuration of a transmitter circuit according to a second embodiment. The configuration of a transmitter circuit HDV1 illustrated in FIG. 4 is similar to that of the transmitter circuit illustrated in FIG. 2 and differs therefrom only in that a temperature detection circuit 15 is newly added, and the logic circuit 14 that performs OR operation is changed to a logic circuit 14A. In FIG. 4, the input circuit 3, level shift circuit 4, decoder 5, and level shift circuit 6 are put together as one circuit block 1A. That is, in FIG. 4, the circuit block 1A includes the input circuit 3, level shift circuit 4, decoder 5, and level shift circuit 6 described using FIG. 2. Further, in FIG. 4, only the power supply terminals TD, TS, TL, TN, TP and TG to which the power supply voltages VDD, VSS, VLL, VPP, VNN, and ground voltage GND are supplied, respectively, are illustrated, and the power supply voltages to be supplied are omitted. Similarly, the transmitter signals Din1 and Din2 are omitted, and only the input terminal TI1 is illustrated in FIG. 4. Further, the configuration of the high voltage driver 2 is also omitted in FIG. 4.

In the second embodiment, the transmitter circuit HDV1 includes a temperature detection circuit 15 that detects a temperature. Although not especially limited, the temperature detection circuit 15 is formed on a semiconductor chip, connected to the power supply terminals TG and TD through power supply lines, and operates using the power supply voltage VDD as the operating voltage. That is, the temperature detection circuit 15 detects whether or not a temperature is equal to or higher than a predetermined temperature and supplies a detection result to the logic circuit 14A as a detection signal (reset signal) TDT. The detection signal TDT is a signal whose high level corresponds to the voltage level of the power supply voltage VDD and whose low level corresponds to the ground voltage GND. The temperature detection circuit 15 makes the detection signal TDT high level when the temperature is equal to or higher than a predetermined temperature, and makes the detection signal TDT low level when the temperature is lower than a predetermined temperature.

In the configuration of FIG. 2, the logic circuit 14 performs OR operation among three inputs. On the other hand, in the second embodiment, the three-input logic circuit 14 is changed to the four-input logic circuit 14A. That is, the logic circuit 14A is supplied further with the detection signal TDT in addition to the reset signals PR1 to PR3 as with the logic circuit 14. That is, the logic circuit 14A performs OR operation among the reset signals PR1, PR2, and PR3, and detection signal TDT. A result of the OR operation is supplied to the decoder 5 (FIG. 2) as the synthesized reset signal PCM as in the transmitter circuit of FIG. 2.

As in the first embodiment, when the absolute value of the voltage of at least one of the power supply voltages VDD, VSS, and VLL becomes equal to or less than a predetermined value, a reset signal among the reset signals PR1 to PR3 corresponding to the power supply voltage whose value has become equal to or less than a predetermined value becomes high level. Further, when the temperature becomes equal to or higher than a predetermined value, the detection signal TDT becomes high level. Thus, the synthesized reset signal PCM output from the logic circuit 14A becomes high level when the absolute value of the voltage of at least one of the power supply voltages VDD, VSS, and VLL becomes equal to less than a predetermined value or when the temperature becomes equal to or higher than a predetermined temperature.

As described using FIG. 2, when the synthesized reset signal PCM becomes high level, the N-type FET N1 and P-type FET P1 in the high voltage driver 2 are made non-conductive. That is, unlike the first embodiment, the N-type FET N1 and P-type FET P1 are made non-conductive also when the temperature becomes equal to or higher than a predetermined temperature.

The N-type FET N1 and P-type FET P1 that constitute the high voltage driver 2 output the high voltage power supply voltages VPP and VNN, respectively. Therefore, the transistors (N1, P1) are likely to increase in temperature and have thus a risk of damage due to heat. If the transistors are damaged, a leak current flows between the power supply voltage VPP and/or power supply voltage VNN and the node nd through the transistors. When the leak current flows, the peripheral components such as the pulser semiconductor device CHP and/or receiver circuit are disadvantageously damaged.

The temperature detection circuit 15 is provided on the same semiconductor chip on which the transistors (N1, P1) are provided. Therefore, for example, a temperature lower than a temperature of the semiconductor chip at which the transistors may be broken is set as the predetermined temperature. Thus, it is possible to prevent temperature rise by making the transistors non-conductive before breaking of the transistors to disconnect current paths of the transistors.

Third Embodiment

Figure 5:
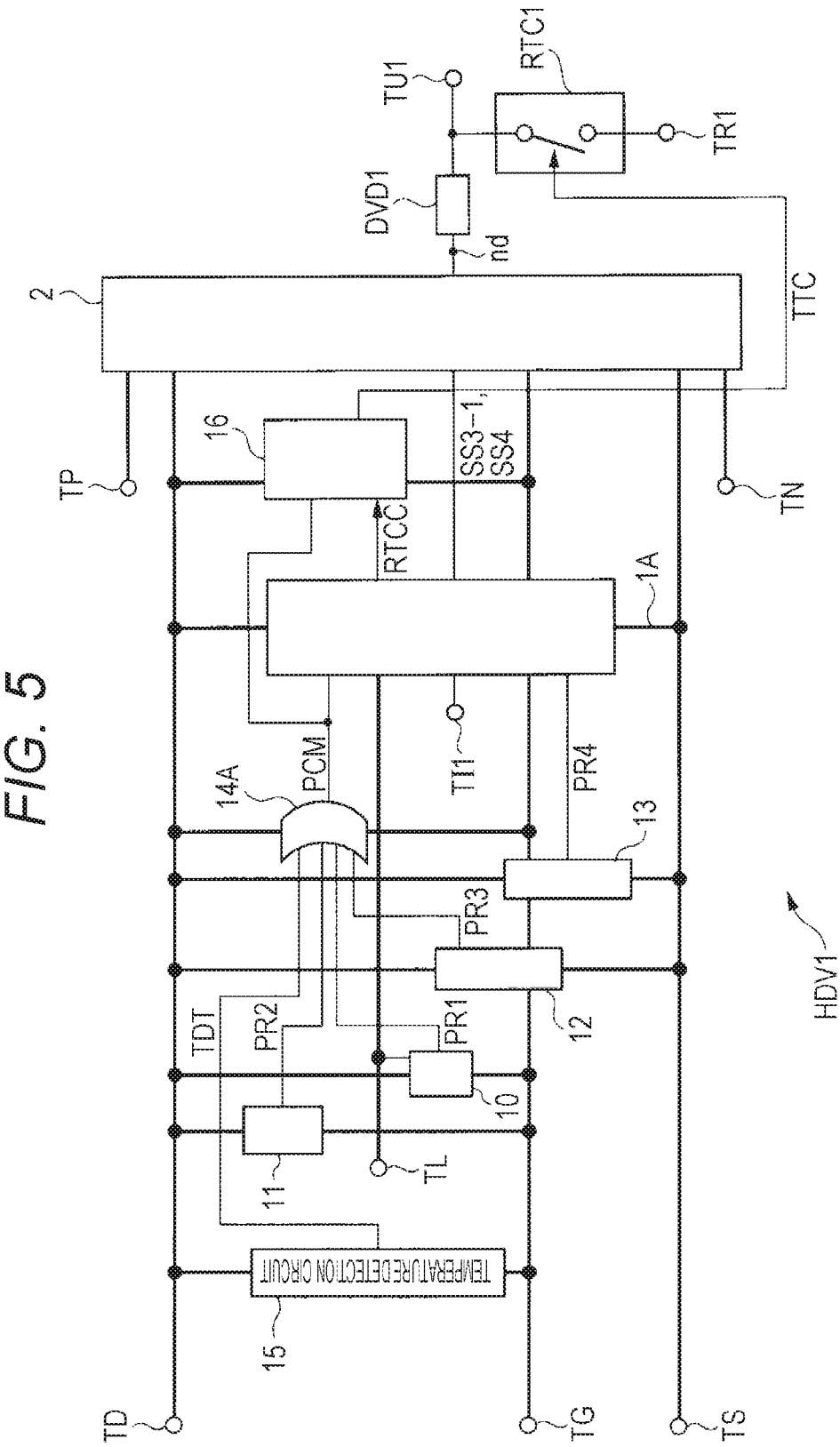
FIG. 5 is a block diagram illustrating a configuration of a transmitter circuit according to a third embodiment.

FIG. 5 is a block diagram illustrating a configuration of a transmitter circuit according to a third embodiment. The configuration of a transmitter circuit HDV1 illustrated in FIG. 5 is similar to that illustrated in FIG. 4. Hereinafter, different points from the transmitter circuit of FIG. 4 will be mainly described. The transmitter circuit HDV1 of FIG. 5 newly includes a transmitter and receiver separation switch control circuit 16 compared to the transmitter circuit of FIG. 4. The transmitter and receiver separation switch control circuit 16 is a circuit that controls the transmitter and receiver separation switch RTC1 described using FIG. 6.

In FIG. 5, the input/output terminal TU1 and output terminal TR1 of the pulser semiconductor device CHP, separation circuit DVD1, and transmitter and receiver separation switch RTC1 are illustrated, compared to the components illustrated in FIG. 4. As described using FIG. 6, the input/output terminal TU1 of the pulser semiconductor device CHP is connected to the ultrasound oscillator HB1, and the output terminal TR1 is connected to the input of the receiver circuit RCV1. The configuration of the separation circuit DVD1 has been described using FIG. 1, so the description thereof will be omitted.

The transmitter and receiver separation switch control circuit 16 is connected to the power supply terminals TD and TG through power supply lines and operates using the power supply voltage VDD as the operating voltage. Thus, although not especially limited, the transmitter and receiver separation switch control circuit 16 outputs, to the transmitter and receiver separation switch RTC1, a switch control signal TTC whose high level corresponds to the voltage level of the power supply voltage VDD and whose low level corresponds to the voltage level of the ground voltage GND. The transmitter and receiver separation switch control circuit 16 receives an output signal RTCC from the decoder 5 (FIG. 1, FIG. 2) in the circuit block 1A and the synthesized reset signal PCM, and forms and outputs the switch control signal TTC.

As described using FIG. 1, the decoder 5 forms four output signals based on the transmitter signals Din1 and Din2. Two of the four output signals output, i.e., output signals SS3-1 and SS3-2 are used for controlling conduction of the N-type FET N1 and P-type FET P1, respectively.

Although not especially limited, in the third embodiment, one of the remaining two output signals is used as the above-mentioned output signal RTCC.

The decoder 5 makes the output signal RTCC, for example, high level by combination of the transmitter signals Din1 and Din2. The transmitter and receiver separation switch control circuit 16 makes the switch control signal TTC high level in response to high level of the output signal RTCC. When the switch control signal TTC becomes high level, the transmitter and receiver separation switch RTC1 is made conductive. When the transmitter and receiver separation switch RTC1 is made conductive, the input/output terminal TU1 is electrically connected to the output terminal TR1 through the transmitter and receiver separation switch RTC1. As a result, a minute detection signal from the ultrasound oscillator HB1 is input to the receiver circuit RCV1 and then amplified.

On the other hand, when conduction/non-conduction of the N-type FET N1 and P-type FET P1 is controlled by the transmitter signals Din1 and Din2, the low level output signal RTCC is output from the decoder 5. When the output signal RTCC becomes low level, the transmitter and receiver separation switch control circuit 16 makes the switch control signal TTC low level. As a result, the transmitter and receiver separation switch RTC1 is made non-conductive. That is, the input/output terminal TU1 and output terminal TR1 are electrically separated. Thus, it is possible to prevent a high voltage from being supplied to the receiver circuit RCV1 while the transmitter circuit HDV1 outputs the high voltage power supply voltage.

However, if the transmitter and receiver separation switch is made conductive when the absolute value of the voltage of at least one of the power supply voltages VDD, VSS, and VLL becomes equal to or less than a predetermined value to cause erroneous output of a high voltage from the transmitter circuit HDV1, the high voltage is disadvantageously supplied to the receiver circuit RCV1 through the transmitter and receiver separation switch RTC1. In this case, the receiver circuit may be damaged or broken by the high voltage.

In the third embodiment, when the synthesized reset signal PCM becomes high level, the transmitter and receiver separation switch control circuit 16 makes the switch control signal TTC low level irrespective of the level of the output signal RTCC. As a result, the transmitter and receiver separation switch RTC1 is made non-conductive. That is, when the absolute value of the voltage of the power supply voltages VDD, VSS, and VLL becomes equal to or less than a predetermined value, the transmitter and receiver separation switch RTC1 is forcibly made non-conductive.

In the third embodiment, when the absolute value of the voltage of at least one of the power supply voltages VDD, VSS, and VLL becomes equal to or less than a predetermined value, control is performed so as to prevent a high voltage from being output from the high voltage driver 2, as described in the first and second embodiment. In addition, when the absolute value of the voltage of at least one of the power supply voltages VDD, VSS, and VLL becomes equal to or less than a predetermined value, the transmitter and receiver separation switch RTC1 is controlled to be made non-conductive. As a result, it is possible to more reliably prevent the peripheral components such as the receiver circuit from being damaged or broken.

In the third embodiment, the output signal of the decoder 5 is used to control conduction/non-conduction of the transmitter and receiver separation switch RTC1; however, the present invention is not limited to this. Further, in the third embodiment, when the switch control signal TTC is at high level, the transmitter and receiver separation switch RTC1 is made conductive; however, as a matter of course, the transmitter and receiver separation switch RTC1 may be made conductive when the switch control signal TTC is at low level.

In the first to third embodiments, the output signals SS3-1 and SS3-2 that control conduction of the transistors in the high voltage driver 2 are formed by the decoder 5; however, a circuit that forms the output signals SS3-1 and SS3-2 is not limited to the decoder, but may be any circuit as long as it is an internal circuit. For example, in a case where four transmitter signals Din1 to Din4 are supplied from a not illustrated processor to the input circuit 3 to cause output signals obtained by level-shifting the respective transmitter signals Din1 to Din4 to be output from the level shift circuit 4, these output signals are retained by the respective flip-flop circuits FF1 to FF4 illustrated in FIG. 7. Also in this case, as illustrated in FIG. 7, the synthesized reset signal PCM is supplied to the clear terminal C. This eliminates the need to provide the decoder circuit DEC in the internal circuit.

Further, in the first to third embodiments, the present invention has been described taking the transmitter circuit as an example; however, the present invention may be applied to an electronic circuit that operates using a plurality of types of power supply voltages including the positive and negative polarities as the operating voltage. Further, in the first to third embodiments, the field effect type transistors are used; however, the present invention is not limited to this.

While the present invention made by the present inventors has been described in detail based on the preferred embodiments thereof, it is to be understood that the present invention is not limited to the above-mentioned embodiments but may be variously modified within the scope of the present invention.

What is claimed is:
1. An electronic circuit comprising:
a first level shift circuit that is supplied with a reference voltage, a first voltage having a first potential on a first polarity side with respect to the reference voltage, and a second voltage having a second potential higher than the first potential, supplied with an input signal whose voltage is changed between the reference voltage and the first voltage, and outputs a first output signal obtained by level-shifting the input signal;
an internal circuit that is supplied with the reference voltage and the second voltage, receives the first output signal, and outputs second and third output signals according to the first output signal;
a second level shift circuit that is supplied with the reference voltage, the second voltage, and a third voltage having a third potential on a second polarity side with respect to the reference voltage and outputs a fourth output signal obtained by level-converting the third output signal;
first and second transistors whose current paths are connected in series between a fourth voltage having a fourth potential higher than the second potential on the first polarity side with respect to the reference voltage and a fifth voltage having a fifth potential higher than the third potential on the second polarity side with respect to the reference voltage;
a high voltage circuit that is supplied with the reference voltage, the second voltage, the third voltage, the fourth voltage, and the fifth voltage, controls conduction of the first transistor according to the second output sig- nal, and controls conduction of the second transistor according to the fourth output signal;

a first protective circuit that controls the internal circuit such that the internal circuit outputs the second and third output signals having levels that make the respective first and second transistors non-conductive when an absolute value of a potential of at least one of the first, second, and third voltages becomes equal to or less than a predetermined value; and a second protective circuit that controls the second level shift circuit so that the second transistor is made non-conductive by the fourth output signal when the absolute value of the potential of the second voltage becomes equal to or less than a predetermined value.

2. The electronic circuit according to claim 1, wherein the first protective circuit includes:

a first power-on reset circuit that is supplied with the reference voltage, the first voltage, and the second voltage and outputs a first reset signal whose potential is changed between the reference voltage and second voltage when the absolute value of the potential of the first voltage becomes equal to or less than a predetermined. value;

a second power-on reset circuit that is supplied with the reference voltage and the second voltage and outputs a second reset signal whose potential is changed between the reference voltage and second voltage when the absolute value of the potential of the second voltage becomes equal to or less than a predetermined value;

a third power-on reset circuit that is supplied with the reference voltage, the second voltage, and the third voltage and outputs a third reset signal whose potential is changed between the reference voltage and second voltage when the absolute value of the potential of the third voltage becomes equal to or less than a predetermined value; and a logic circuit that controls the internal circuit based on a change of any one of the first, second, and third reset signals.

3. The electronic circuit according to claim 2, wherein the second protective circuit includes a fourth power-on reset circuit that is supplied with the reference voltage, the second voltage, and the third voltage and outputs a fourth reset signal whose potential is changed between the reference voltage and third voltage when the absolute value of the potential of the second voltage becomes equal to or less than a predetermined value, and the second level shift circuit includes a limiting circuit that limits a potential of the fourth output signal according to the fourth reset signal from the fourth power-on reset circuit.

4. The electronic circuit according to claim 3, further comprising a temperature detection circuit that outputs a detection signal whose potential is changed between the reference voltage and second voltage according to a temperature, wherein the detection signal is supplied to the logic circuit, and when the temperature becomes equal to or higher than a predetermined temperature, the first and second transistors are made non-conductive.

5. A pulse transmitter semiconductor device including the electronic circuit as claimed in claim 4, comprising:

a plurality of power supply terminals supplied respectively with the reference voltage, first voltage, second voltage, third voltage, fourth voltage, and fifth voltage;

an input/output terminal connected with a connecting portion between the first and second transistors;

a transmitter and receiver separation switch connected between the input/output terminal and a receiver circuit; and a transmitter and receiver separation switch control circuit that controls the transmitter and receiver separation switch, wherein the transmitter and receiver separation switch control circuit is controlled by the logic circuit.

6. The electronic circuit according to claim 1, wherein the reference voltage is a ground voltage, and the first and second polarity sides are a positive side and a negative side, respectively, with respect to the ground voltage, and the first and second transistors are a P-channel type transistor and an N-channel type transistor, respectively.

7. An electronic circuit that operates using, as an operating voltage, at least a first positive low-voltage power supply, a second positive low-voltage power supply providing a voltage higher than that of the first positive low-voltage power supply, a first negative low-voltage power supply, a first positive high-voltage power supply providing a voltage higher than that of the second positive low-voltage power supply, and a first negative high-voltage power supply providing a voltage lower than that of the first negative low-voltage power supply, the electronic circuit comprising:

a first level shift circuit that converts an input signal having a voltage level of the first positive low-voltage power supply into an output signal having a voltage level of the second positive low-voltage power supply;

an internal circuit that operates using the second positive low-voltage power supply, supplied with the output signal from the first level shift circuit, and forms first and second output signals according to the supplied output signal;

a second level shift circuit that converts a voltage level of the second output signal from the voltage level of the second positive low-voltage power supply to that of the first negative low-voltage power supply;

a high voltage driver that receives the first output signal and an output signal from the second level shift circuit and outputs a signal having a voltage level of the first positive high-voltage power supply or first negative low-voltage power supply;

a first reset circuit that is supplied with the first positive low-voltage power supply, second positive low-voltage power supply, and ground voltage and outputs a reset signal whose high level corresponds to the voltage level of the second positive low-voltage power supply and whose low level corresponds to the voltage level of the ground voltage when the voltage of the first positive low-voltage power supply becomes equal to or less than a predetermined value;

a second reset circuit that is supplied with the second positive low-voltage power supply and ground voltage and outputs a reset signal whose high level corresponds to the voltage level of the second positive low-voltage power supply and whose low level corresponds to the voltage level of the ground voltage when the voltage of the second positive low-voltage power supply becomes equal to or less than a predetermined value;

a third reset circuit that is supplied with the second positive low-voltage power supply, first negative low-voltage power supply, and ground voltage and outputs a reset signal whose high level corresponds to the voltage level of the second positive low-voltage power supply and whose low level corresponds to the voltage level of the ground voltage when an absolute value of the voltage of the first negative low-voltage power supply becomes equal to or less than a predetermined value;

a fourth reset circuit that is supplied with the second positive low-voltage power supply, first negative low-voltage power supply, and ground voltage and outputs a reset signal whose high level corresponds to the voltage level of the ground voltage and whose low level corresponds to the voltage level of the first negative low-voltage power supply when the voltage of the second positive low-voltage power supply becomes equal to or less than a predetermined value; and a logic circuit that receives the reset signals from the first, second, and third reset circuits and puts the internal circuit into a predetermined state when one of the first positive low-voltage power supply, second positive low-voltage power supply, and first negative low-voltage power supply becomes equal to or less than a predetermined value, wherein when the voltage of the second positive low-voltage power supply becomes equal to or less than a predetermined value, the second level shift circuit is put into a predetermined state by the reset signal from the fourth reset circuit.

8. The electronic circuit according to claim 7, further comprising a temperature detection circuit that outputs a detection signal when a temperature becomes equal to or higher than a predetermined temperature, wherein the logic circuit performs OR operation among the detection signals from the first reset circuit, second reset circuit, third reset circuit, and temperature detection circuit and puts the internal circuit into a predetermined state when one of the first positive low-voltage power supply, second positive low-voltage power supply, and first negative low-voltage power supply becomes equal to or less than a predetermined value or when the temperature becomes equal to or higher than a predetermined temperature.

9. The electronic circuit according to claim 8, wherein the internal circuit includes a decoder that decodes the output of the first level shift circuit.

10. A pulse transmitter semiconductor device including the electronic circuit as claimed in claim 8, comprising:

an input/output terminal to which a signal output from the high voltage driver is transmitted;

a transmitter and receiver separation switch connected between the input/output terminal and a receiver circuit; and a transmitter and receiver separation switch control circuit that controls the transmitter and receiver separation switch according to a result of OR operation from the logic circuit, wherein the transmitter and receiver separation switch control circuit makes the transmitter and receiver separation switch non-conductive to electrically separate the high voltage driver and receiver circuit when one of the first positive low-voltage power supply, second positive low-voltage power supply, and first negative low-voltage power supply becomes equal to or less than a predetermined value or when the temperature becomes equal to or higher than a predetermined temperature.

* * * * *